(12) United States Patent
Masuda

(10) Patent No.: US 8,913,671 B2
(45) Date of Patent: Dec. 16, 2014

(54) DATA RECEIVING CIRCUIT, DATA TRANSMITTING CIRCUIT, DATA TRANSMITTING AND RECEIVING DEVICE, DATA TRANSMISSION SYSTEM, AND DATA RECEIVING METHOD

(71) Applicant: Sony Corporation, Tokyo (JP)

(72) Inventor: Takashi Masuda, Tokyo (JP)

(73) Assignee: Sony Corporation, Tokyo (JP)

( * ) Notice: Subject to any disclaimer, the term of this patent is extended or adjusted under 35 U.S.C. 154(b) by 47 days.

(21) Appl. No.: 13/765,410

(22) Filed: Feb. 12, 2013

(65) Prior Publication Data

US 2013/0235912 A1    Sep. 12, 2013

(30) Foreign Application Priority Data

Mar. 6, 2012    (JP) ................ 2012-048786

(51) Int. Cl.
  *H04L 27/00*    (2006.01)
  *H04L 25/02*    (2006.01)
  *H04L 1/00*    (2006.01)
  *H04L 7/033*    (2006.01)
  *H03L 7/087*    (2006.01)

(52) U.S. Cl.
  CPC .......... *H04L 1/0023* (2013.01); *H04L 25/0272* (2013.01); *H04L 7/0331* (2013.01); *H03L 7/087* (2013.01)
  USPC ............................ 375/259; 375/295; 375/316

(58) Field of Classification Search
  USPC ......... 375/219, 256–257, 259–260, 295, 316; 326/30, 83, 86, 90, 136; 327/108
  See application file for complete search history.

(56) References Cited

U.S. PATENT DOCUMENTS

| 7,519,130 | B2 * | 4/2009 | Hsu et al. ...................... 375/292 |
| 8,396,093 | B2 * | 3/2013 | Schilling et al. .............. 375/130 |
| 2005/0094737 | A1 * | 5/2005 | Vorenkamp .................... 375/257 |
| 2005/0278160 | A1 * | 12/2005 | Donnelly et al. .............. 703/19 |
| 2007/0049235 | A1 * | 3/2007 | Kyung .......................... 455/313 |
| 2008/0057900 | A1 * | 3/2008 | Fang et al. .................... 455/296 |
| 2010/0316141 | A1 * | 12/2010 | Derby ........................... 375/257 |
| 2010/0321069 | A1 * | 12/2010 | Komatsu et al. .............. 327/108 |
| 2011/0164693 | A1 * | 7/2011 | Komatsu et al. .............. 375/259 |
| 2012/0007701 | A1 * | 1/2012 | Kaeriyama ................. 333/24 R |
| 2013/0251140 | A1 * | 9/2013 | Ransijn et al. ........... 379/399.01 |

FOREIGN PATENT DOCUMENTS

JP    10-145436    5/1998

* cited by examiner

*Primary Examiner* — Jean B Corrielus
(74) *Attorney, Agent, or Firm* — Rader, Fishman & Grauer PLLC

(57) ABSTRACT

Disclosed herein is a data receiving circuit including a transmitting section configured to transmit an identifying signal used to identify a state of connection of the data receiving circuit, the identifying signal making potential transitions periodically, in an in-phase signal via a transmission path having AC coupling to a data transmitting circuit for transmitting data in a differential signal via the transmission path.

17 Claims, 14 Drawing Sheets

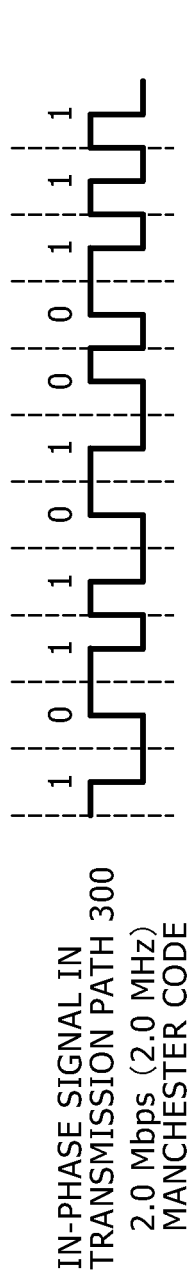
FIG.6A IN-PHASE SIGNAL IN TRANSMISSION PATH 300
2.0 Mbps (2.0 MHz)
MANCHESTER CODE
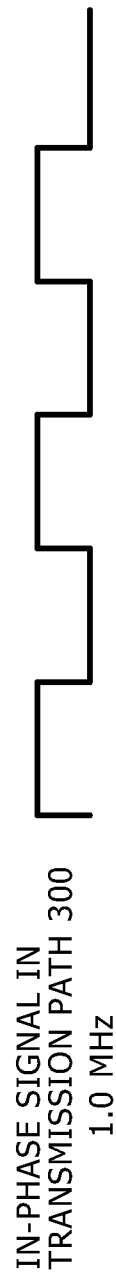
FIG.6B IN-PHASE SIGNAL IN TRANSMISSION PATH 300
1.0 MHz
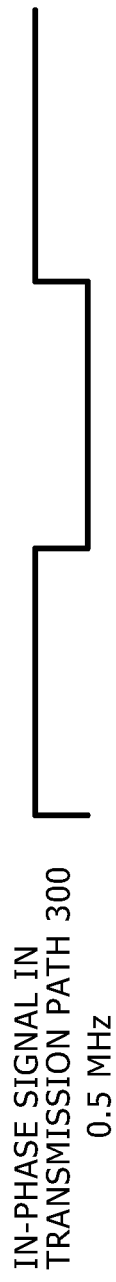
FIG.6C IN-PHASE SIGNAL IN TRANSMISSION PATH 300
0.5 MHz

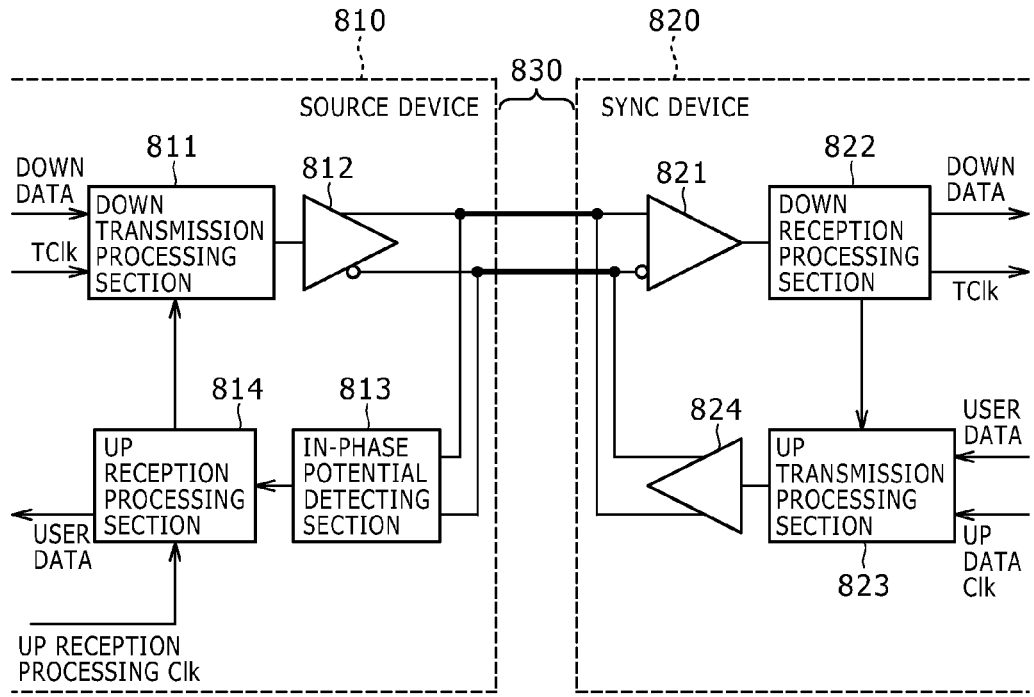
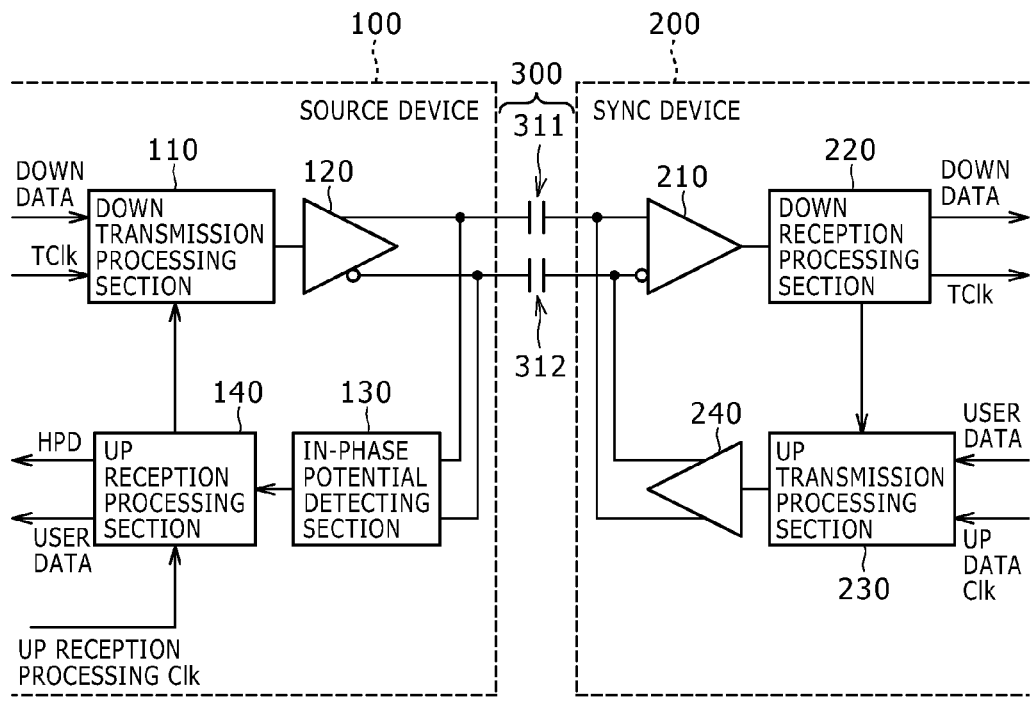

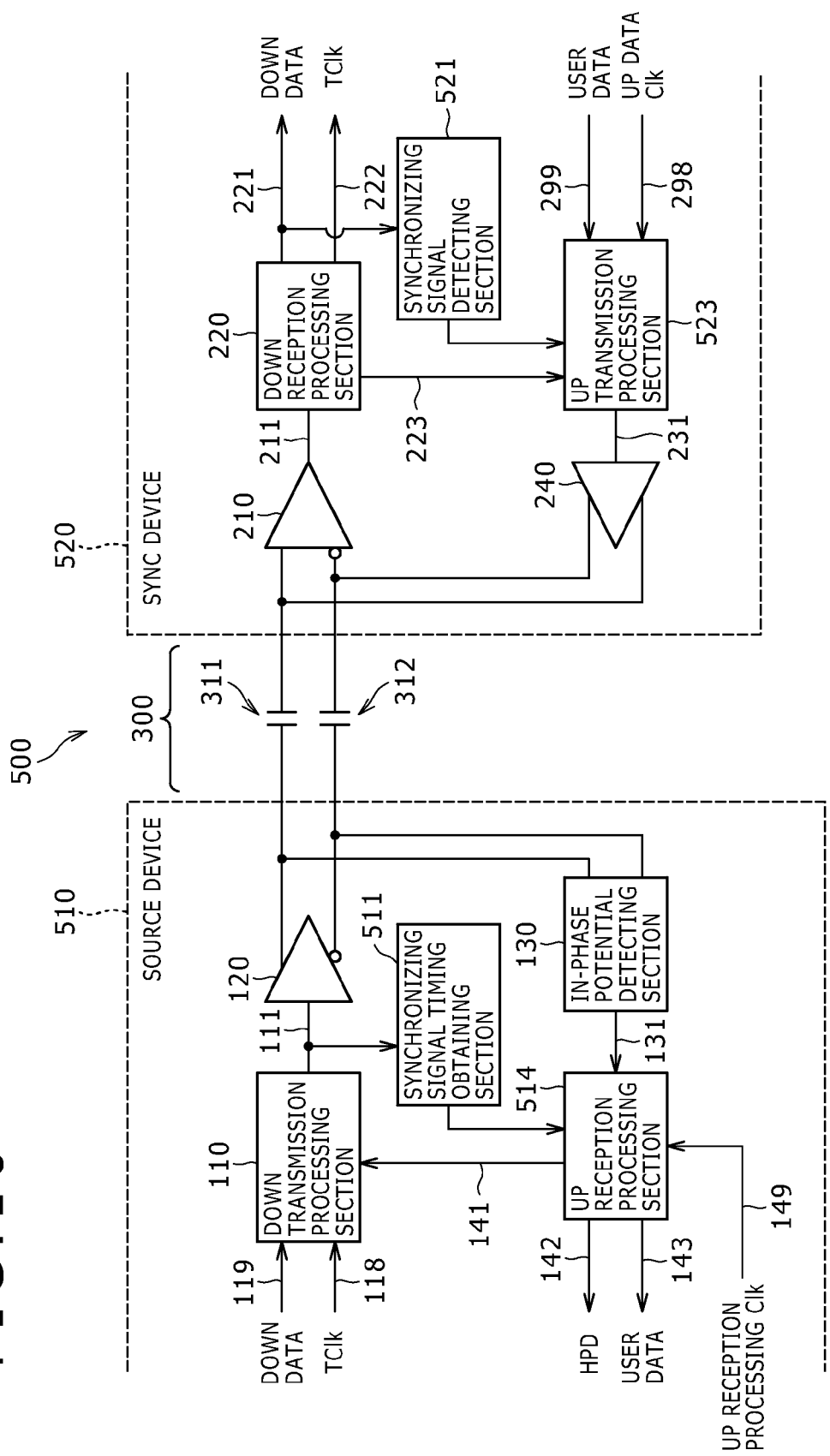

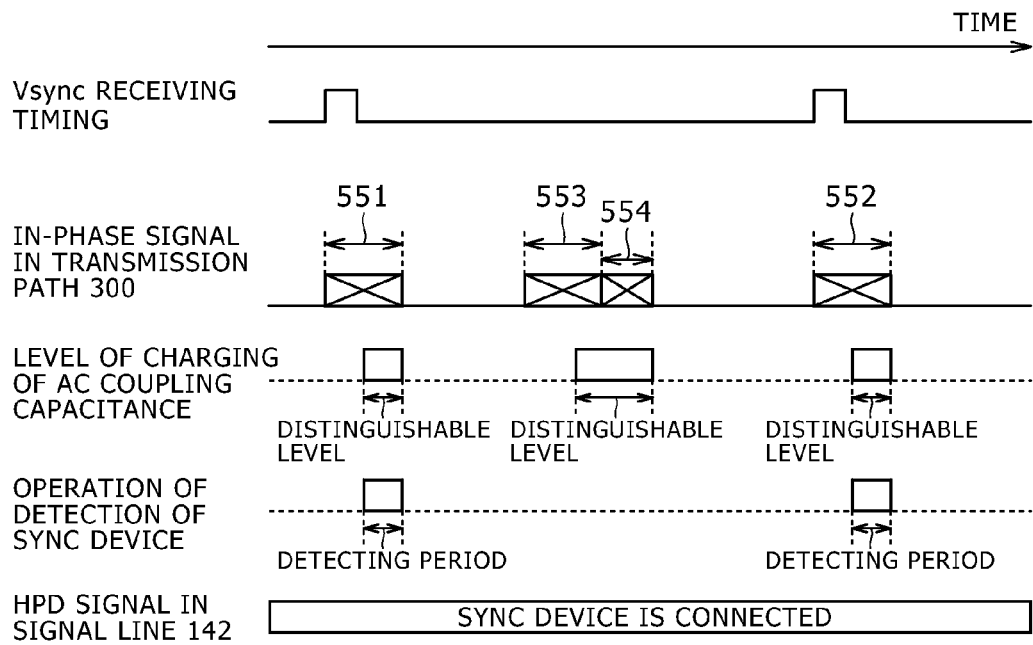
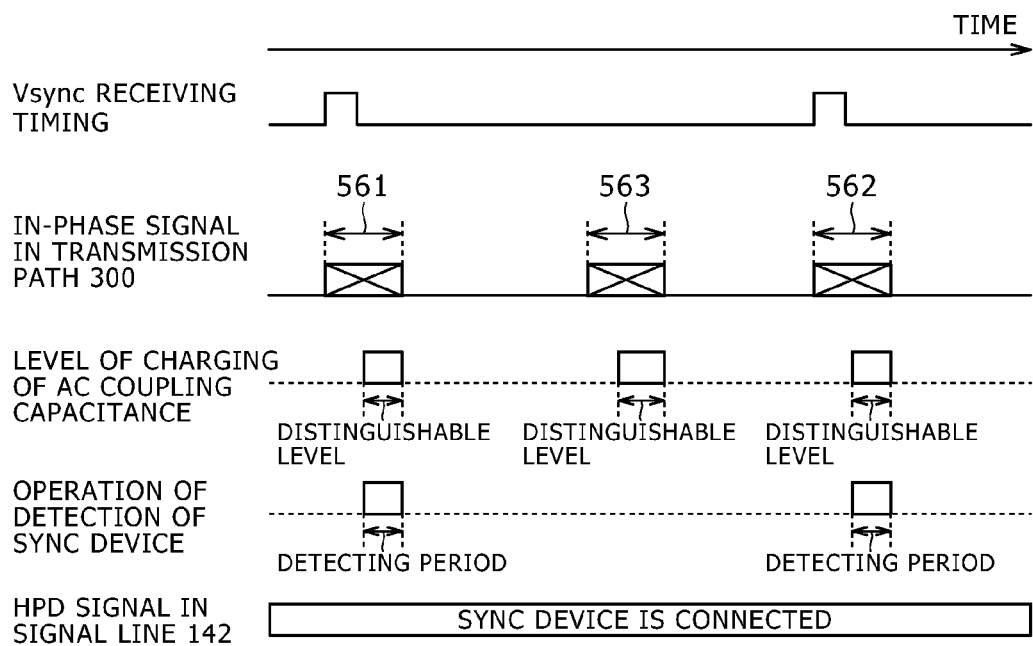

DATA RECEIVING CIRCUIT, DATA TRANSMITTING CIRCUIT, DATA TRANSMITTING AND RECEIVING DEVICE, DATA TRANSMISSION SYSTEM, AND DATA RECEIVING METHOD

The present disclosure contains subject matter related to that disclosed in Japanese Priority Patent Application JP 2012-048786 filed in the Japan Patent Office on Mar. 6, 2012, the entire content of which is hereby incorporated by reference.

BACKGROUND

The present technology relates to a data receiving circuit, and particularly to a data receiving circuit, a data transmitting circuit, a data transmitting and receiving device, a data transmission system, and a data receiving method for bidirectional transmission using a differential signal and an in-phase signal.

In related art, a device for communicating data at high speed using serial transfer has been realized. For example, as such a device, a device transmitting a differential signal using a pair of signal lines has been realized (see Japanese Patent Laid-Open No. Hei 10-145436 (hereinafter referred to as Patent Document 1), for example).

In the transmission of the differential signal using the pair of signal lines, high-speed data transfer is performed from a device (source device) on a transmitting side to a device (sync device) on a receiving side using the differential signal. In addition, in this transmission, data is transmitted from the sync device to the source device by transmission and reception of an in-phase signal via the pair of signal lines through which the differential signal is transmitted.

SUMMARY

In the above-described related art, data can be transmitted from the sync device to the source device using the in-phase signal.

However, in the above-described related art, the transmission path does not have AC (alternating current) coupling. Problems may therefore occur in protection against an inflow of a large current when the transmission path is short-circuited to another power supply (for example a battery short circuit in a vehicle-mounted device) or in data transmission between devices with a potential difference, for example. That is, the above-described related art in which the differential signal is used for down data transmission and the in-phase signal is used for up data transmission is vulnerable to faults that can occur in the transmission path, and may thus decrease convenience. It is accordingly important to improve convenience in a device using a differential signal for down data transmission and using an in-phase signal for up data transmission.

The present technology has been created in view of such a situation. It is desirable to improve convenience in bidirectional transmission using a differential signal and an in-phase signal.

According to an embodiment of the present technology, there are provided a data receiving circuit and a data receiving method, the data receiving circuit including a transmitting section configured to transmit an identifying signal used to identify a state of connection of the data receiving circuit, the identifying signal making potential transitions periodically, in an in-phase signal via a transmission path having AC coupling to a data transmitting circuit for transmitting data in a differential signal via the transmission path. This produces an effect of being able to supply, in the in-phase signal, the identifying signal for identifying the state of connection of the data receiving circuit for receiving the differential signal transmitted via the transmission path having the AC coupling to the data transmitting circuit via the transmission path having the AC coupling.

In addition, in the first embodiment, data to be transmitted from the data receiving circuit to the data transmitting circuit may be transmitted in the in-phase signal, and the transmitting section may transmit the identifying signal in a period of not transmitting the data to the data transmitting circuit. This produces an effect of the identifying signal being transmitted in the period of not transmitting the data to the data transmitting circuit in the in-phase signal.

In addition, in the first embodiment, a duty ratio of the in-phase signal in a period of transmitting the data and the duty ratio of the in-phase signal in a period of transmitting the identifying signal may be each about 50%. This produces an effect of a capacitance forming the AC coupling being charged in the period of transmitting the data and the period of transmitting the identifying signal.

In addition, in the first embodiment, the data receiving circuit may further include a clock generating section configured to synchronize, in timing of being supplied with a reference clock signal for notifying a clock of the differential signal from the data transmitting circuit, a clock generated by the clock generating section with the supplied reference clock signal, wherein when the transmitting section needs to receive the reference clock signal, the transmitting section may transmit a reference clock signal requesting signal to be identified by the data transmitting circuit as a request to transmit the reference clock signal, the reference clock signal requesting signal making potential transitions periodically with a pulse width different from a pulse width of the identifying signal. This produces an effect of the reference clock signal requesting signal and the identifying signal being transmitted in the in-phase signal.

In addition, in the first embodiment, when the transmitting section transmits neither of data to be transmitted to the data transmitting circuit and the reference clock signal requesting signal, the transmitting section may transmit the identifying signal. This produces an effect of the identifying signal being transmitted in a period in which the data to be transmitted to the data transmitting circuit and the reference clock signal requesting signal are not transmitted in the in-phase signal.

In addition, in the first embodiment, the data receiving circuit may further include a detecting section configured to detect a synchronizing signal included in the data transmitted from the data transmitting circuit, wherein the transmitting section may transmit the identifying signal when the synchronizing signal is detected by the detecting section. This produces an effect of the identifying signal being transmitted when the synchronizing signal included in the data transmitted from the data transmitting circuit is detected.

In addition, in the first embodiment, the detecting section may detect, as the synchronizing signal, at least one of a vertical synchronizing signal and a horizontal synchronizing signal of an image constituting the data transmitted from the data transmitting circuit. This produces an effect of the identifying signal being transmitted when at least one of the vertical synchronizing signal and the horizontal synchronizing signal of the image is detected.

In addition, in the first embodiment, when the transmitting section transmits data to the data transmitting circuit, the transmitting section may start to transmit the data after transmitting the identifying signal for about a time necessary to charge a capacitance of the AC coupling. This produces an effect of the data being transmitted in the in-phase signal after the capacitance of the AC coupling is charged.

In addition, according to a second embodiment of the present technology, there is provided a data transmitting circuit including: a transmitting section configured to transmit a differential signal to a transmission path having AC coupling; and a detecting section configured to detect whether an identifying signal used to identify a state of connection of a data receiving circuit, the identifying signal making potential transitions periodically, is supplied in an in-phase signal via the transmission path. This produces an effect of being able to detect the state of connection of the data receiving circuit for receiving the differential signal transmitted via the transmission path having the AC coupling on the basis of the identifying signal supplied in the in-phase signal via the transmission path having the AC coupling.

In addition, in the second embodiment, the detecting section may detect the identifying signal in timing of receiving the in-phase signal transmitted by the data receiving circuit in response to reception of at least one of a vertical synchronizing signal and a horizontal synchronizing signal of an image constituting data transmitted in the differential signal. This produces an effect of the state of connection of the data receiving circuit being detected only in the timing of receiving the in-phase signal transmitted according to timing of the reception of the vertical synchronizing signal and the horizontal synchronizing signal of the image.

In addition, according to a third embodiment of the present technology, there is provided a data transmitting and receiving device including: a first transmitting section configured to transmit a differential signal to a first transmission path having AC coupling; and a second transmitting section configured to transmit an identifying signal used to identify a state of connection of the data transmitting and receiving device, the identifying signal making potential transitions periodically, in an in-phase signal via a second transmission path having AC coupling, the second transmission path being different from the first transmission path, to a data transmitting device for transmitting data in a differential signal via the second transmission path. This produces an effect of being able to supply, in the in-phase signal, the identifying signal for identifying the state of connection of the data transmitting and receiving device receiving the differential signal transmitted via the second transmission path having the AC coupling to the data transmitting device via the second transmission path having the AC coupling, and being able to supply the differential signal via the first transmission path.

In addition, according to a fourth embodiment of the present technology, there is provided a data transmission system including: a data transmitting device including a transmitting section configured to transmit a differential signal to a transmission path having AC coupling and a receiving section configured to receive an in-phase signal in the transmission path; and a data receiving device including a receiving section configured to receive the transmitted differential signal and a transmitting section configured to transmit an identifying signal used to identify a state of connection of the data receiving device, the identifying signal making potential transitions periodically, in the in-phase signal to the data transmitting device via the transmission path. This produces an effect of the data receiving device transmitting, in the in-phase signal, the identifying signal for identifying the state of connection of the data receiving device for receiving the differential signal transmitted via the transmission path having the AC coupling, and the data transmitting device receiving the transmitted in-phase signal.

The present technology can produce an excellent effect of being able to improve convenience in bidirectional transmission using a differential signal and an in-phase signal.

BRIEF DESCRIPTION OF THE DRAWINGS

FIGS. 6A, 6B, and 6C are schematic diagrams showing an example of an in-phase signal transmitted by the up transmission processing section in the first embodiment of the present technology;

FIGS. 7A and 7B are diagrams schematically showing an example of the data transmission system in the first embodiment of the present technology and an example of another data transmission system;

FIG. 10 is a schematic diagram showing an example of functional configuration of a data transmission system in a second embodiment of the present technology;

FIGS. 11A and 11B are diagrams schematically showing an example of an in-phase signal transmitted in the data transmission system in the second embodiment of the present technology;

DETAILED DESCRIPTION OF THE PREFERRED EMBODIMENTS

A mode for carrying out the present technology (which mode will hereinafter be referred to as embodiments) will hereinafter be described. Description will be made in the following order.

1. First Embodiment (Data Transmission Control: Example of Realizing HPD (Hot Plug Detect) by Beacon Signal)
2. Second Embodiment (Data Transmission Control: Example of Synchronizing Timing of Transmission of Beacon Signal with Transmission Data of Source Device)
3. Examples of Modification

1. First Embodiment

[Example of Functional Configuration of Data Transmission System]

Figure 1:
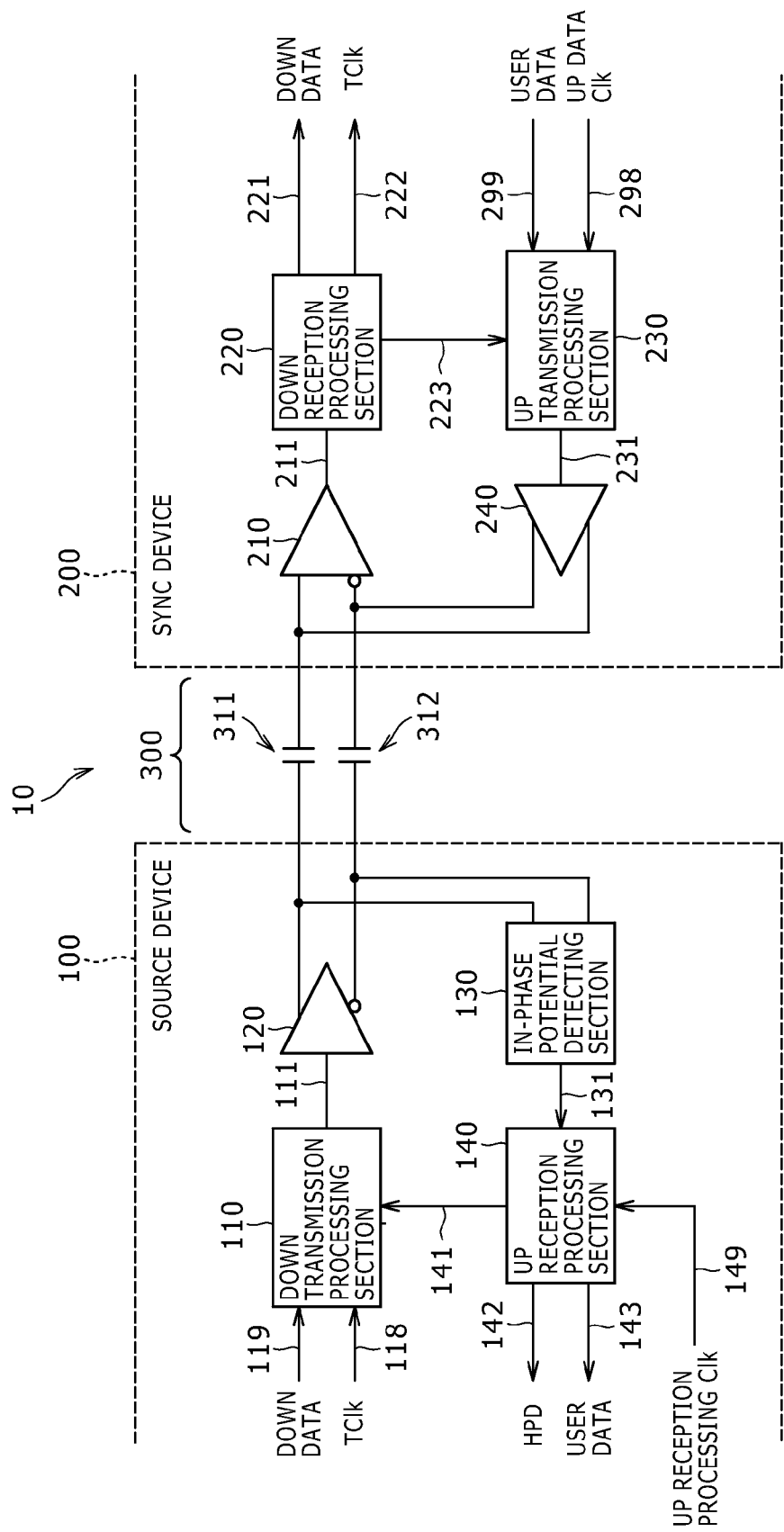
FIG. 1 is a schematic diagram showing an example of functional configuration of a data transmission system in a first embodiment of the present technology.

FIG. 1 is a schematic diagram showing an example of functional configuration of a data transmission system 10 in a first embodiment of the present technology.

Incidentally, FIG. 1 shows only functional configurations relating to data transmission in a device (source device 100) on a data transmitting side and a device (sync device 200) on a data receiving side in the data transmission system 10, and does not show other functional configurations.

The data transmission system 10 performs serial transfer of data by a differential signal via a pair of signal lines (transmission path 300). The data transmission system 10 includes the source device 100, the sync device 200, and the transmission path 300 as a path of data being transmitted.

Incidentally, the embodiment of the present technology will be described assuming that capacitances (AC coupling capacitances 311 and 312) are provided for a pair of signal lines, and that the sync device 200 and the source device 100 are coupled to each other by AC coupling. Incidentally, the AC coupling capacitances (capacitors) may be disposed on the board of the source device 100, disposed on the board of the sync device 200, disposed on each of the boards of both the devices, or disposed in a removable cable (transmission path 300), for example. However, in the embodiment of the present technology, the AC coupling capacitances in the transmission path will be shown as a pair of capacitances (AC coupling capacitances 311 and 312) in the pair of signal lines of the transmission path 300.

In addition, the embodiment of the present technology will be described assuming that a signal of in-phase potential (in-phase signal) is transmitted from the sync device 200 to the source device 100 via the transmission path 300. Incidentally, a method of data transmission for transmitting a down signal in a differential signal via a pair of signal lines (transmission path 300) and transmitting an up signal in an in-phase signal is similar to that described in Patent Document 1, and therefore detailed description thereof will herein be omitted.

The source device 100 includes a down transmission processing section 110, a differential driver 120, an in-phase potential detecting section 130, and an up reception processing section 140.

The down transmission processing section 110 determines data to be transmitted from the source device 100 to the sync device 200, and supplies the determined data to the differential driver 120. For example, when data (down data) is to be transmitted to the sync device 200, the down transmission processing section 110 synchronizes the down data with a transmission clock (represented as Tclk in FIG. 1), which is a clock for transmission, and supplies the synchronized down data to the differential driver 120. Incidentally, FIG. 1 shows a signal line (signal line 119) for supplying the down data to the down transmission processing section 110 and a signal line (signal line 118) for supplying the transmission clock Tclk to the down transmission processing section 110.

In addition, when a reference clock transmission instruction is supplied from the up reception processing section 140 via a signal line 141, the down transmission processing section 110 supplies a clock obtained by frequency-dividing the transmission clock Tclk by N to the differential driver 120 as a reference clock (REF). Incidentally, the down transmission processing section 110 will be described with reference to FIG. 2, and therefore description thereof will be omitted here.

The differential driver 120 generates a differential signal to perform serial transfer of a signal supplied from the down transmission processing section 110 via the pair of signal lines (transmission path 300). The differential driver 120 generates a pair of signals in opposite phase from each other (differential signal), and supplies the generated signal to the sync device 200 via the transmission path 300.

The in-phase potential detecting section 130 receives an in-phase signal supplied from the sync device 200 via the transmission path 300. The in-phase potential detecting section 130 supplies the received in-phase signal to the up reception processing section 140 via a signal line 131.

The up reception processing section 140 analyzes the signal supplied from the in-phase potential detecting section 130, and outputs a result of the analysis. For example, when a signal transmitted in the in-phase signal is up data (hereinafter referred to as user data), the up reception processing section 140 supplies the user data to a circuit using the user data in the source device 100 via a signal line 143.

In addition, when a signal transmitted in the in-phase signal is a signal requesting the reference clock (which signal will hereinafter be referred to as a reference clock requesting signal (REFREQ)), the up reception processing section 140 supplies a reference clock transmission instruction to the down transmission processing section 110 via the signal line 141.

Further, when a signal that is different from the user data and the reference clock requesting signal and which signal makes potential transitions periodically with a predetermined pulse width is transmitted in the in-phase signal, the up reception processing section 140 sets the potential of an HPD (Hot Plug Detect) signal to the potential of an H (High) level. Incidentally, in embodiments of the present technology, the signal making potential transitions periodically with the predetermined pulse width will be described as a beacon signal. The HPD signal is a signal for indicating a state of connection of the sync device (whether the sync device is connected or not). That is, when the beacon signal is received in the in-phase signal, the up reception processing section 140 determines that the sync device is connected. The up reception processing section 140 supplies the HPD signal with the potential at the H-level to a circuit using an HPD function via a signal line 142.

Incidentally, a few methods are conceivable as a method for identifying the three signals (the user data, the beacon signal, and the reference clock requesting signal) in the in-phase signal. However, description in the following will be made assuming that respective different clocks (pulse widths) are used for the three kinds of signals. The up reception processing section 140 therefore analyzes the in-phase signal using an up reception processing Clk supplied via a signal line 149. Incidentally, the up reception processing section 140 will be described with reference to FIG. 3, and therefore description thereof will be omitted here.

The sync device 200 includes a differential receiver 210, a down reception processing section 220, an up transmission processing section 230, and an in-phase driver 240.

The differential receiver 210 receives a differential signal supplied via the transmission path 300. The differential receiver 210 receives the differential signal transmitted by the differential driver 120 in the source device 100, and supplies the received signal to the down reception processing section 220 via a signal line 211.

The down reception processing section 220 analyzes the signal supplied from the differential receiver 210, and outputs a result of the analysis. For example, when down data is transmitted in the differential signal, the down reception processing section 220 supplies the down data to a circuit using the down data in the sync device 200 via a signal line 221. In addition, when the reference clock needs to be received, the down reception processing section 220 supplies a signal for transmitting a reference clock requesting signal (REFREQ) (reference clock requesting transmission instruction) to the up transmission processing section 230 via a signal line 223.

Further, when the reference clock is received, the down reception processing section 220 synchronizes a clock (reference clock) used when the down reception processing section 220 detects down data with the reference clock. Incidentally, the down reception processing section 220 supplies the transmission clock (Tclk) to a circuit using the transmission clock (Tclk) in the sync device 200 via a signal line 222. Incidentally, the down reception processing section 220 will be described with reference to FIG. 4, and therefore description thereof will be omitted here.

The up transmission processing section 230 determines data to be transmitted from the sync device 200 to the source device 100, and supplies the determined data to the in-phase driver 240. For example, when the up transmission processing section 230 is supplied with the reference clock requesting transmission instruction from the down reception processing section 220, the up transmission processing section 230 supplies the reference clock requesting signal (REFREQ) to the in-phase driver 240 via a signal line 231.

In addition, when the up transmission processing section 230 is supplied with data as an object of transmission (user data) in a case where the up transmission processing section 230 is not supplied with the reference clock requesting transmission instruction, the up transmission processing section 230 supplies the user data to the in-phase driver 240. In this case, the up transmission processing section 230 synchronizes the user data with an up transmission clock (represented as an up data Clk in FIG. 1), which is a clock for data transmission in an up direction (transmission by an in-phase signal), and supplies the synchronized user data to the in-phase driver 240. Incidentally, FIG. 1 shows a signal line (signal line 299) for supplying the user data to the up transmission processing section 230 and a signal line (signal line 298) for supplying the up data Clk to the up transmission processing section 230.

In addition, when the up transmission processing section 230 is not supplied with the user data as an object of transmission in the case where the up transmission processing section 230 is not supplied with the reference clock requesting transmission instruction, the up transmission processing section 230 supplies a beacon signal to the in-phase driver 240. Incidentally, the up transmission processing section 230 will be described with reference to FIG. 5, and therefore description thereof will be omitted here.

The in-phase driver 240 generates an in-phase signal to transfer a signal supplied from the up transmission processing section 230 via the pair of signal lines (transmission path 300). The in-phase driver 240 supplies the generated in-phase signal to the in-phase potential detecting section 130 in the source device via the transmission path 300. Incidentally, the in-phase driver 240 and the up transmission processing section 230 is an example of a transmitting section described in claims.

[Example of Functional Configuration of Down Transmission Processing Section]

Figure 2:
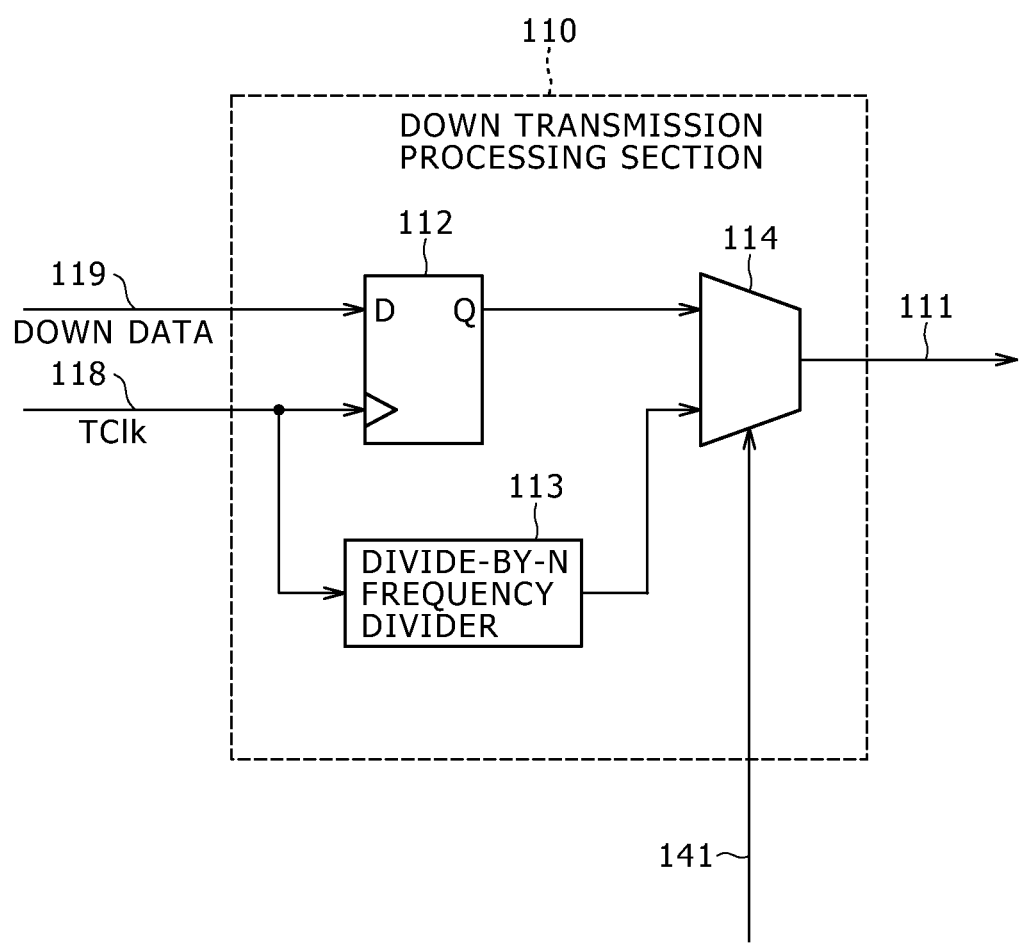
FIG. 2 is a schematic diagram showing an example of functional configuration of a down transmission processing section in the first embodiment of the present technology.

FIG. 2 is a schematic diagram showing an example of functional configuration of the down transmission processing section 110 in the first embodiment of the present technology.

The down transmission processing section 110 determines data to be transmitted to the sync device 200, and supplies the determined data to the differential driver 120. The down transmission processing section 110 includes a D-type flip-flop 112, a divide-by-N frequency divider 113 (N is an integer), and a selector 114.

The D-type flip-flop 112 generates down data synchronized with the timing of the transmission clock (Tclk) on the basis of the down data supplied via the signal line 119 and the transmission clock (Tclk) supplied via the signal line 118. The D-type flip-flop 112 supplies the down data synchronized with the transmission clock (Tclk) to one of two inputs in the selector 114.

The divide-by-N frequency divider 113 generates the reference clock by frequency-dividing the transmission clock (Tclk) by N. The divide-by-N frequency divider 113 supplies the generated reference clock to the other of the two inputs in the selector 114 (other than the input for the down data).

The selector 114 selects which of the down data and the reference clock to supply to the differential driver 120. When the selector 114 is supplied with the reference clock transmission instruction from the up reception processing section 140 (for example the potential of the signal line 141 is at an H-level), the selector 114 supplies the reference clock to the differential driver 120. In addition, when the potential of the signal line 141 is low (L), the selector 114 supplies the down data to the differential driver 120.

[Example of Functional Configuration of Up Reception Processing Section]

Figure 3:
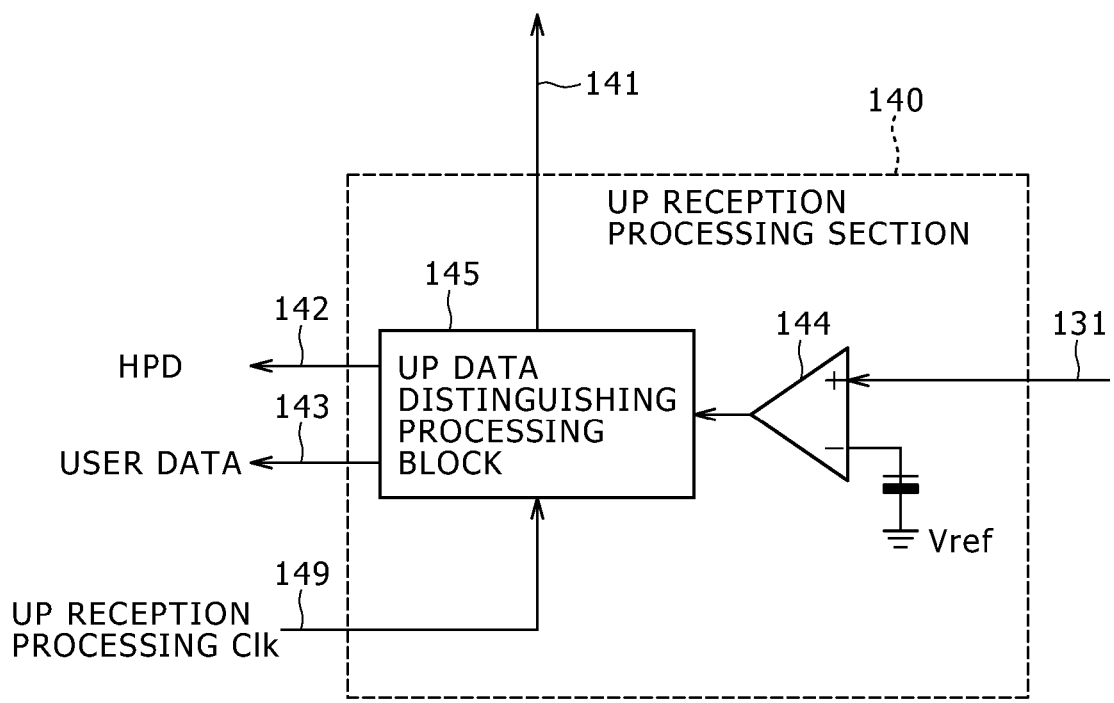
FIG. 3 is a schematic diagram showing an example of functional configuration of an up reception processing section in the first embodiment of the present technology.

FIG. 3 is a schematic diagram showing an example of functional configuration of the up reception processing section 140 in the first embodiment of the present technology.

The up reception processing section 140 analyzes a signal supplied from the in-phase potential detecting section 130, and outputs a result of the analysis. The up reception processing section 140 includes a comparator 144 and an up data distinguishing processing block 145.

The comparator 144 compares the signal supplied from the in-phase potential detecting section 130 with a reference potential (Vref), which is a predetermined potential. The comparator 144 supplies a result of the comparison (an H-level and an L-level) to the up data distinguishing processing block 145.

The up data distinguishing processing block 145 distinguishes information included in the in-phase signal by comparing the signal (comparison result) supplied from the comparator 144 with the up reception processing Clk supplied via the signal line 149. For example, suppose that the sync device 200 outputs the in-phase signal including a beacon signal of 0.5 MHz, a reference clock requesting signal of 1.0 MHz, or user data of 2.0 Mbps (2.0 MHz). In this case, when the up data distinguishing processing block 145 detects one of the clocks, and thereby detects the reference clock requesting signal, the up data distinguishing processing block 145 supplies the reference clock transmission instruction to the down transmission processing section 110 via the signal line 141. In addition, when the up data distinguishing processing block 145 detects the user data, the up data distinguishing processing block 145 subjects the user data to data processing (for example a process of encoding coding data, the addition of a header, and the like) for using the user data in the system. Then, the up data distinguishing processing block 145 synchronizes the user data with the up reception processing Clk, and outputs the synchronized user data via the signal line 143.

In addition, when the potential of the signal supplied from the comparator 144 makes transitions (when one of the user data, the beacon signal, and the reference clock requesting signal is included), the up data distinguishing processing block 145 sets the potential of the HPD signal to an H-level. That is, when the signal supplied from the comparator 144 varies between the H-level and the L-level, the up data distinguishing processing block 145 outputs the HPD signal indicating that the sync device is connected via the signal line 142.

Incidentally, at a time of a first transmission to the sync device 200, the up data distinguishing processing block 145 optimizes the operation clock of the up data distinguishing processing block 145 itself using the reference clock requesting signal supplied from the sync device 200 as a training signal. Specifically, the up data distinguishing processing block 145 performs training on the basis of the reference clock requesting signal, and adjusts the frequency of the clock generated by an operation clock supply source (not shown) of the up data distinguishing processing block 145 itself to a frequency that enables user data to be analyzed. For example, when the clock of the reference clock requesting signal is 1.0 MHz, and the clock of the user data is 2.0 MHz, the up data distinguishing processing block 145 adjusts the frequency of the clock generated by the operation clock supply source to a clock that is 2.0 MHz or lower and which is sufficient for the analysis.

Thus, by performing the training, provisions can be made for different clock speeds of user data transmitted by sync devices. That is, even when the transmission speed of the transmitted user data is different for different sync devices, the source device 100 can properly analyze the data.

[Example of Functional Configuration of Down Reception Processing Section]

Figure 4:
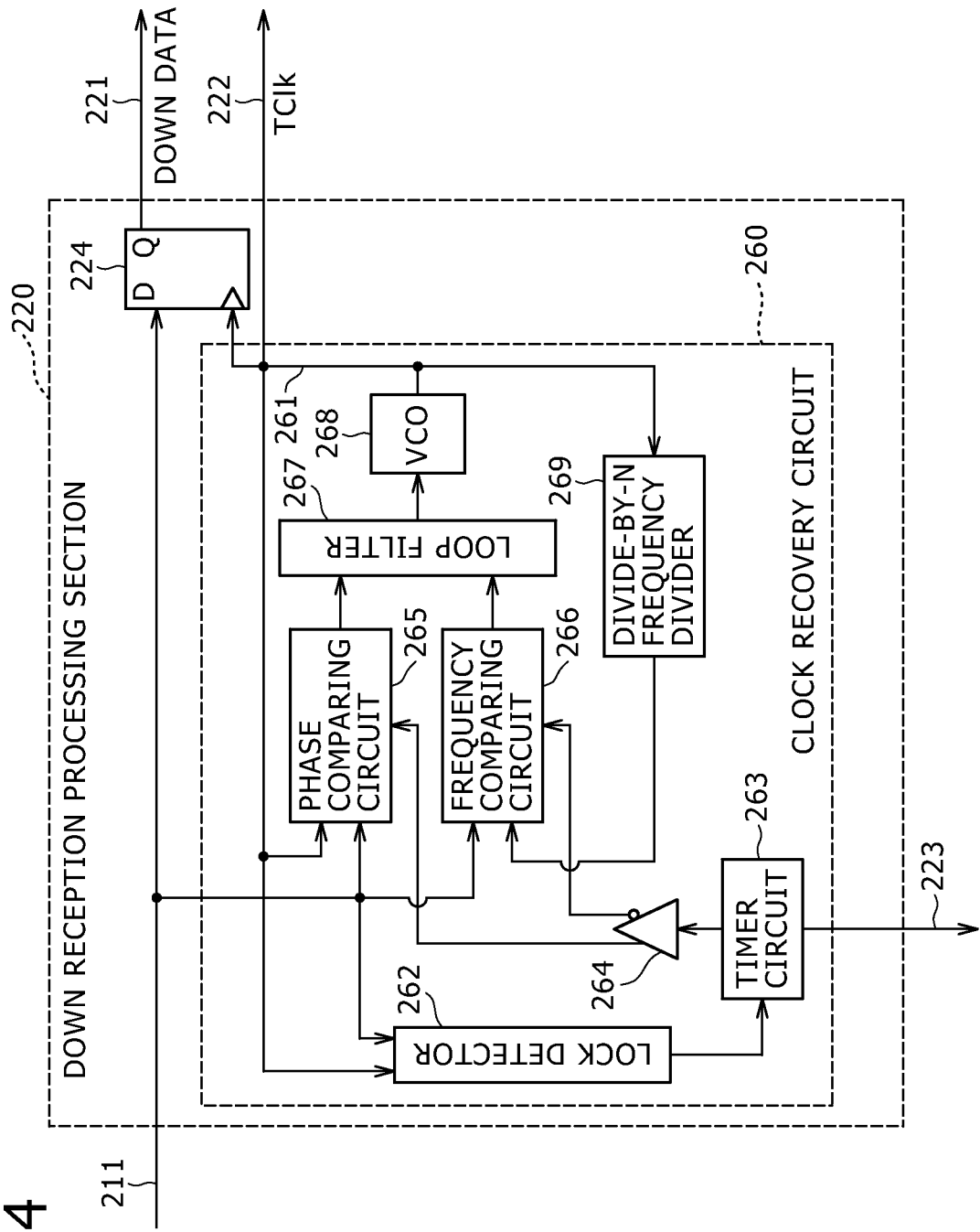
FIG. 4 is a schematic diagram showing an example of functional configuration of a down reception processing section in the first embodiment of the present technology.

FIG. 4 is a schematic diagram showing an example of functional configuration of the down reception processing section 220 in the first embodiment of the present technology.

The down reception processing section 220 analyzes a signal supplied from the differential receiver 210, and outputs a result of the analysis. The down reception processing section 220 includes a D-type flip-flop 224 and a clock recovery circuit 260.

The D-type flip-flop 224 is similar to the D-type flip-flop 112 shown in FIG. 2. The D-type flip-flop 224 synchronizes the down data supplied via the signal line 211 with the transmission clock (Tclk) supplied from the clock recovery circuit 260 via a signal line 261. The D-type flip-flop 224 then outputs the down data synchronized with the transmission clock (Tclk) via the signal line 221.

The clock recovery circuit 260 generates the transmission clock (Tclk), which is a clock for synchronizing the down data. Incidentally, the clock recovery circuit 260 can be implemented in a similar manner to that described in Patent Document 1, for example. Thus, the clock recovery circuit 260 in FIG. 4 will be described briefly, and detailed description thereof will be omitted.

The clock recovery circuit 260 includes a lock detector 262, a timer circuit 263, a differential driver 264, a phase comparing circuit 265, a frequency comparing circuit 266, and a loop filter 267. The clock recovery circuit 260 also includes a VCO (Voltage Controlled Oscillator) 268 and a divide-by-N frequency divider 269. Incidentally, the phase comparing circuit 265, the frequency comparing circuit 266, the loop filter 267, the VCO 268, and the divide-by-N frequency divider 269 form a PLL (Phase Locked Loop) circuit in the clock recovery circuit 260.

The lock detector 262 detects a shift (clock shift) between the signal supplied via the signal line 211 (the down data or the reference clock) and the signal supplied via the signal line 261 (transmission clock (Tclk)). When the lock detector 262 has detected a clock shift, the lock detector 262 supplies a signal indicating that the clock shift is detected to the timer circuit 263. Then, receiving the signal indicating that the clock shift is detected, the timer circuit 263 supplies the reference clock requesting transmission instruction to the up transmission processing section 230 via the signal line 223 (for example changes the potential of the signal line 223 to an H-level). In addition, in the clock recovery circuit 260, the frequency comparing circuit 266 synchronizes the transmission clock (Tclk) using the reference clock supplied via the signal line 211.

When synchronization between the transmission clock (Tclk) of the signal line 261 and the signal of the signal line 211 is detected, the timer circuit 263 withdraws the reference clock requesting transmission instruction (for example changes the potential of the signal line 223 to an L (Low) level). In addition, in the clock recovery circuit 260, switching is performed from the frequency comparing circuit 266 to the phase comparing circuit 265, and the transmission clock (Tclk) synchronized with the down data is generated.

[Example of Functional Configuration of Up Transmission Processing Section]

Figure 5:
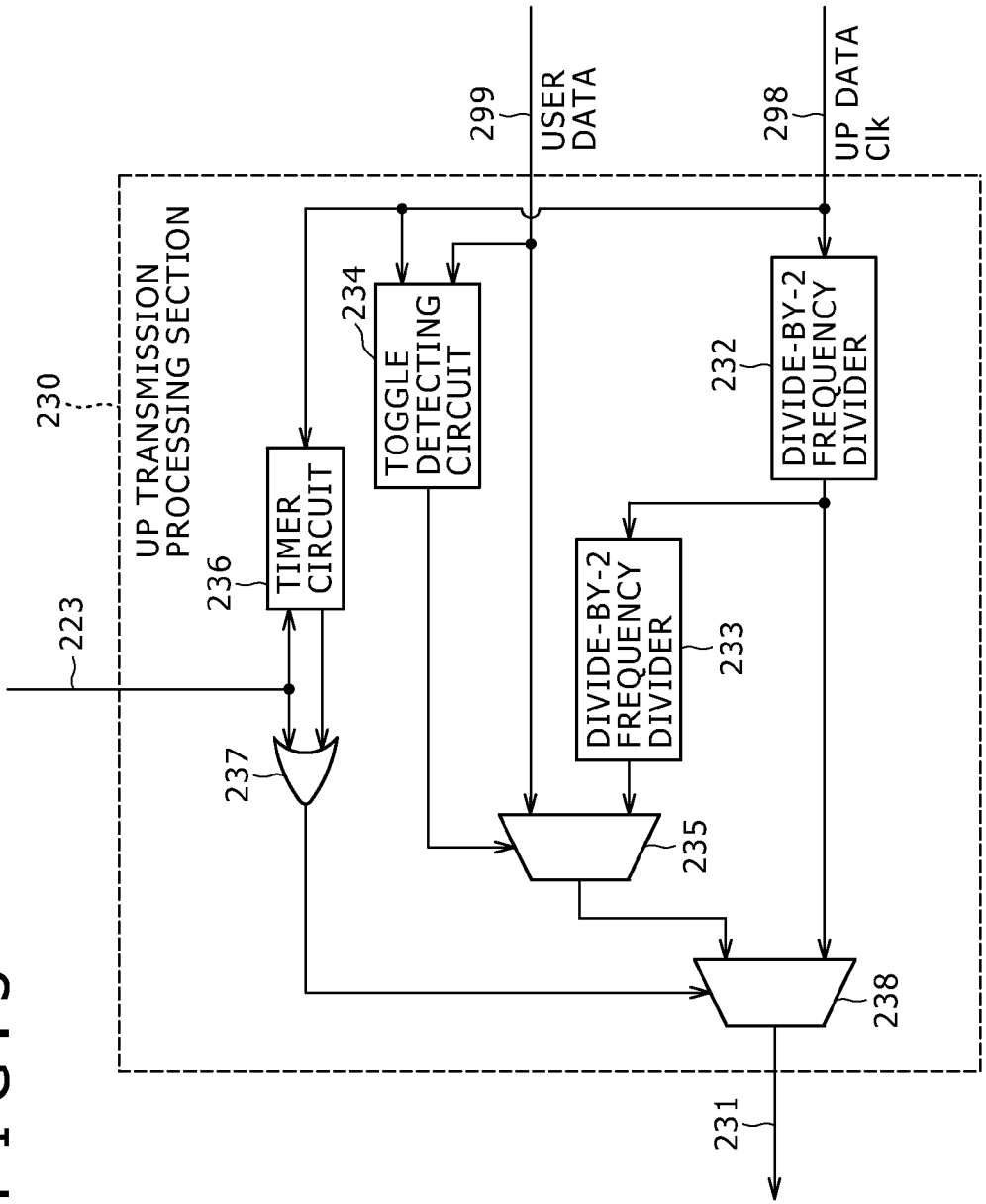
FIG. 5 is a schematic diagram showing an example of functional configuration of an up transmission processing section in the first embodiment of the present technology.

FIG. 5 is a schematic diagram showing an example of functional configuration of the up transmission processing section 230 in the first embodiment of the present technology.

The up transmission processing section 230 determines data to be transmitted as in-phase signal. The up transmission processing section 230 includes a divide-by-two frequency divider 232, a divide-by-two frequency divider 233, a toggle detecting circuit 234, a first selector 235, a timer circuit 236, an OR circuit 237, and a second selector 238.

The divide-by-two frequency divider 232 frequency-divides the up data Clk supplied via the signal line 298 by two. Specifically, when the up data Clk is a clock of 2.0 MHz, 2.0 MHz is frequency-divided by two to generate a clock of 1.0 MHz. The divide-by-two frequency divider 232 supplies the generated clock to the second selector 238 and the divide-by-two frequency divider 233. It is to be noted that the clock supplied from the divide-by-two frequency divider 232 to the second selector 238 is used as reference clock requesting signal (REFREQ). That is, the divide-by-two frequency divider 232 functions as a section for generating the reference clock requesting signal (REFREQ).

The divide-by-two frequency divider 233 further frequency-divides the clock supplied from the divide-by-two frequency divider 232 by two. For example, when the divide-by-two frequency divider 233 is supplied with the clock of 1.0 MHz, the divide-by-two frequency divider 233 generates a clock of 0.5 MHz. The divide-by-two frequency divider 233 supplies the generated clock to the first selector 235. It is to be noted that the clock supplied from the divide-by-two frequency divider 233 to the first selector 235 is used as beacon signal. That is, the divide-by-two frequency divider 233 functions as a section for generating the beacon signal.

The toggle detecting circuit 234 detects potential transitions in the signal line 299, and thereby detects whether or not there is user data to be transmitted as in-phase signal. Specifically, when the potential of the signal line 299 makes transitions, the toggle detecting circuit 234 determines that data (user data) to be transmitted to the source device 100 is supplied to the up transmission processing section 230. Then, when the toggle detecting circuit 234 has detected that the user data is supplied, the toggle detecting circuit 234 supplies a signal indicating that the user data is supplied to the first selector 235.

The first selector 235 selects which of the user data and the beacon signal to supply to the second selector 238. When the first selector 235 is supplied with the signal indicating that the user data is supplied from the toggle detecting circuit 234, the first selector 235 supplies the user data to the second selector 238.

When the reference clock requesting signal (REFREQ) is to be supplied, the timer circuit 236 and the OR circuit 237 make the reference clock requesting signal (REFREQ) of a predetermined duration or more supplied to the transmission path 300. A time to charge the AC coupling capacitances 311 and 312 can be provided by supplying the reference clock requesting signal of a predetermined duration or more to the transmission path 300. For example, when the potential of the signal line 223 makes a transition from an L-level to an H-level, the timer circuit 236 supplies the H-level signal to the OR circuit 237, and starts a timer. Then, when a predetermined time has passed, the timer circuit 236 changes the output to an L-level. Incidentally, when one of the signal from the timer circuit 236 and the signal from the signal line 223 is at an H-level, the OR circuit 237 supplies a signal to make the reference clock requesting signal transmitted (for example an H-level potential) to the second selector 238.

The second selector 238 selects which of the reference clock requesting signal (REFREQ) and a signal from the first selector 235 (the user data or the beacon signal) to supply to the in-phase driver 240. When the second selector 238 is supplied with the signal to make the reference clock requesting signal (REFREQ) transmitted from the OR circuit 237, the second selector 238 supplies the reference clock requesting signal (REFREQ) to the in-phase driver 240. When the second selector 238 is not supplied with the signal to make the reference clock requesting signal (REFREQ) transmitted from the OR circuit 237, the second selector 238 supplies the signal from the first selector 235 to the in-phase driver 240.

[Example of In-Phase Signal Transmitted by Up Transmission Processing Section]

FIGS. 6A to 6C are schematic diagrams showing an example of the in-phase signal transmitted by the up transmission processing section 230 in the first embodiment of the present technology.

FIG. 6A shows an example of the user data transmitted by the clock of 2.0 Mz. FIG. 6B shows an example of the reference clock requesting signal (REFREQ) transmitted by the clock of 1.0 MHz. FIG. 6C shows an example of the beacon signal transmitted by the clock of 0.5 MHz.

When the signals are transmitted using respective different pulse periods as shown in FIGS. 6A to 6C, the up reception processing section 140 can easily distinguish the three signals from each other. Incidentally, when coding with a known minimum pulse width and a known maximum pulse width such as Manchester coding or the like is applied to the user data, the up reception processing section 140 can distinguish the signals from each other more easily. In addition, when the duty ratio of the three signals is set to 50%, a charge stored in the capacitance (AC coupling capacitances 311 and 312) provided in the transmission path is not discharged, so that changes in pulse width at the capacitance can be minimized. This makes it easy to perform comparison with the reference potential (Vref) in the comparator 144 and distinguish information included in the in-phase signal in the up data distinguishing processing block 145.

Incidentally, when coding with a known minimum pulse width and a known maximum pulse width such as Manchester coding or the like is not used, the user data is provided with a certain limitation, and is thereby distinguished from the other signals (the beacon signal and the reference clock requesting signal).

In addition, in the embodiment of the present technology, description is made of an example in which the differences between the three signals (the user data, the beacon signal, and the reference clock requesting signal) are recognized by differences between the clocks. However, the present technology is not limited to this. Another case where the differences between the three signals are recognized by differences between pulse patterns, for example, is conceivable.

[Example of Effect]

FIGS. 7A and 7B are diagrams schematically showing an example of the data transmission system 10 in the first embodiment of the present technology and an example of another data transmission system.

FIG. 7A shows a source device 810, a sync device 820, and a transmission path 830 as a configuration of the other data transmission system.

The source device 810 includes a down transmission processing section 811, a differential driver 812, an in-phase potential detecting section 813, and an up reception processing section 814. The sync device 820 includes a differential receiver 821, a down reception processing section 822, an up transmission processing section 823, and an in-phase driver 824.

Incidentally, the configuration of the source device 810 except for the up reception processing section 814 is similar to that of the source device 100 shown in FIG. 1, and therefore detailed description thereof will be omitted in the following. In addition, the configuration of the sync device 820 except for the up transmission processing section 823 is similar to that of the sync device 200 shown in FIG. 1, and therefore detailed description thereof will be omitted in the following.

In the other data transmission system shown in FIG. 7A, user data and a reference clock requesting signal (REFREQ) are transmitted in an in-phase signal. That is, the up transmission processing section 823 does not transmit the beacon signal transmitted by the up transmission processing section 230. The user data and the reference clock requesting signal are generally transmitted with a low frequency in many cases. It is therefore difficult to take the reception of these signals for the detection of an HPD signal. In addition, due to the low frequency of transmission of these signals, providing AC coupling capacitances in the transmission path 830 is also difficult because the AC coupling capacitances are not charged and thus user data cannot be transmitted.

FIG. 7B shows the data transmission system 10 in the first embodiment of the present technology. Incidentally, the data transmission system 10 shown in FIG. 7B is similar to that shown in FIG. 1, and therefore description thereof will be omitted.

The up transmission processing section 230 transmits the beacon signal when the up transmission processing section 230 does not transmit the user data nor the reference clock requesting signal (REFREQ). Therefore the in-phase signal involving potential transitions is transmitted in the transmission path 300 at all times. Thereby HPD based on the in-phase signal can be realized. In addition, when the duty ratio of the user data, the reference clock requesting signal (REFREQ), and the beacon signal is set to 50%, the capacitance (AC coupling capacitances 311 and 312) provided in the transmission path can be charged easily.

Differences between the data transmission system 10 and the other data transmission system shown in FIGS. 7A and 7B will be described with reference to next FIGS. 8A and 8B, with attention directed to in-phase signals.

Figure 8A:
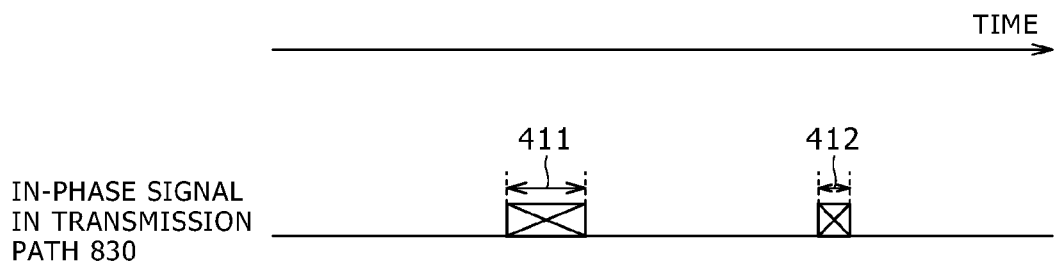
FIGS. 8A and 8B are diagrams schematically showing an example of the in-phase signal transmitted in the data transmission system in the first embodiment of the present technology and an example of an in-phase signal transmitted in the other data transmission system.
Figure 8B:
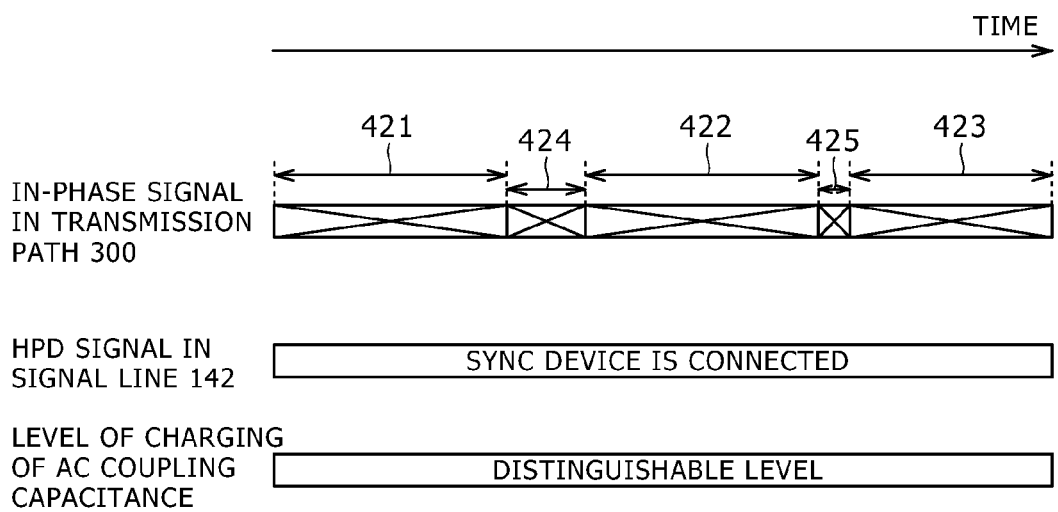

FIGS. 8A and 8B are diagrams schematically showing an example of the in-phase signal transmitted in the data transmission system 10 in the first embodiment of the present technology and an example of the in-phase signal transmitted in the other data transmission system.

FIG. 8A is a timing chart showing an example of the in-phase signal transmitted in the other data transmission system. FIG. 8A schematically shows periods in which the potential of the in-phase signal in the transmission path 830 makes transitions with an axis of abscissas representing a time axis. Incidentally, this timing chart shows a user data transmission period 411 indicating potential transitions in timing of transmission of the user data and a reference clock requesting signal transmission period 412 indicating potential transitions in timing of transmission of the reference clock requesting signal.

Incidentally, in FIGS. 8A and 8B, periods of potential transitions are schematically represented by rectangles having two crossed oblique lines attached thereto.

As shown in FIG. 8A, in the other data transmission system, the potential of the in-phase signal varies only in short periods in which the user data and the reference clock requesting signal are transmitted.

FIG. 8B is a timing chart showing an example of the in-phase signal transmitted in the data transmission system 10 in the first embodiment of the present technology. FIG. 8B schematically shows periods in which the potential of the in-phase signal in the transmission path 300 makes transitions, a state of the HPD signal output from the up reception processing section 140 via the signal line 142, and a state of charging of the AC coupling capacitances 311 and 312, with an axis of abscissas representing a time axis.

FIG. 8B shows beacon signal transmission periods 421 to 423 indicating potential transitions in timing of transmission of the beacon signal, a user data transmission period 424, and a reference clock requesting signal transmission period 425, as periods in which the potential of the in-phase signal in the transmission path 300 makes transitions. As shown in FIG. 8B, in the data transmission system 10, the potential of the in-phase signal makes transitions in all timings. Because the potential of the in-phase signal thus makes transitions with a high frequency, the in-phase signal can be used as a detection signal for the HPD function. In addition, because of the high frequency of potential transitions in the in-phase signal, the AC coupling capacitances 311 and 312 are charged to a level that enables each signal to be distinguished at all times.

Description in the following will be made assuming a case where a cable forming the transmission path 300 is removed. In an initial period after the cable is removed, the source device 100 continues transmitting down data. However, when detecting that the in-phase signal from the sync device 200 makes no potential transitions, the source device 100 sets the potential of the HPD signal in the signal line 142 to an L-level. That is, the potential of the HPD signal makes a transition to a potential indicating that the connection of the sync device cannot be confirmed. Then, the HPD signal at the L-level is supplied to each circuit relating to the transmission of the source device 100, stopping the transmission of the down data. Incidentally, when the cable is connected again after the transmission of the down data is stopped, the sync device 200 outputs the reference clock requesting signal and performs clock synchronization, and data transmission and reception is performed again after the clock synchronization.

[Example of Operation of Up Transmission Processing Section]

The operation of the up transmission processing section 230 in the first embodiment of the present technology will next be described with reference to a drawing.

Figure 9:
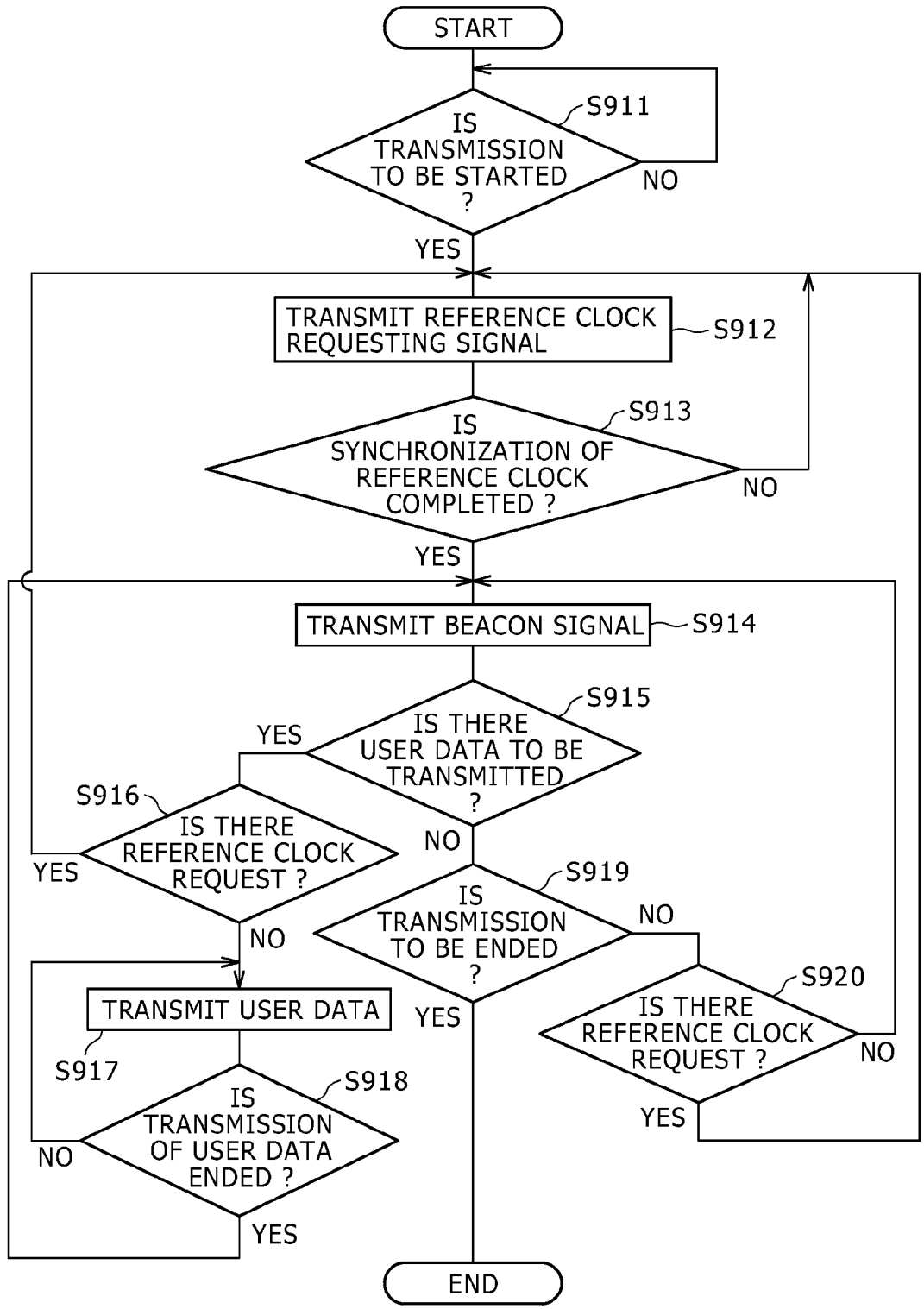
FIG. 9 is a flowchart of an example of a transmission process procedure by the up transmission processing section when the in-phase signal is transmitted from a sync device to a source device in the first embodiment of the present technology.

FIG. 9 is a flowchart of an example of a transmission process procedure by the up transmission processing section 230 when the in-phase signal is transmitted from the sync device 200 to the source device 100 in the first embodiment of the present technology.

First, whether transmission by the in-phase signal is to be started is determined (step S911). When transmission by the in-phase signal is not to be started, an in-phase signal data determining process procedure is set in a standby state. For example, when the source device 100 and the sync device 200 are both turned on, a control section (not shown) of the sync device 200 determines that transmission via the transmission path 300 is to be made.

When it is determined that transmission by the in-phase signal is to be started (step S911), on the other hand, the reference clock requesting signal (REFREQ) is transmitted by the in-phase signal (step S912). Thereafter, whether synchronization of the reference clock in the down reception processing section 220 is completed is determined (step S913). When it is determined that the synchronization of the reference clock is not completed, the transmission of the reference clock requesting signal is continued.

When it is determined that the synchronization of the reference clock is completed (step S913), the beacon signal is transmitted (step S914). Incidentally, this determination is made, that is, it is determined that the synchronization is completed, for example when the reference clock requesting transmission instruction supplied from the down reception processing section 220 is withdrawn (for example the potential of the signal line 223 makes a transition to an L-level).

Next, the up transmission processing section 230 determines whether there is user data as an object of transmission (step S915). When it is determined that there is user data as an object of transmission (step S915), whether the reference clock is requested (whether the reference clock requesting transmission instruction is supplied from the down reception processing section 220) is determined (step S916). When it is determined that the reference clock is requested (step S916), the process returns to step S912, where the reference clock requesting signal is transmitted.

When it is determined that the reference clock is not requested (step S916), on the other hand, user data is transmitted (step S917). The up transmission processing section 230 thereafter determines whether the transmission of the user data is ended (step S918). When it is determined that the transmission of the user data is not ended, the process returns to step S917, where the transmission of the user data is continued.

Incidentally, when it is determined that the transmission of the user data is ended (step S918), the process returns to step S914, where the beacon signal is transmitted.

In addition, when it is determined in step S915 that there is no user data as an object of transmission, whether the transmission is to be ended is determined (step S919). When it is determined that the transmission is to be ended, the operation of the in-phase signal transmitting process is ended. Incidentally, as for determining whether the transmission is to be ended, it is determined that the transmission is to be ended when a differential signal cannot be transmitted from the source device 100 to the sync device 200, for example when the devices are turned off or when the cable forming the transmission path is removed.

When it is determined that the transmission is not to be ended (step S919), on the other hand, whether the reference clock is requested (whether the reference clock requesting transmission instruction is supplied from the down reception processing section 220) is determined (step S920). When it is determined that the reference clock is requested (step S920), the process returns to step S912, where the reference clock requesting signal is transmitted. When it is determined that the reference clock is not requested (step S920), the process returns to step S914, where the beacon signal is transmitted. That is, when the reference clock is not requested nor is there user data as an object of transmission, the beacon signal is transmitted continuously.

Thus, according to the first embodiment of the present technology, data transmission using an in-phase signal in an AC coupled transmission path is made possible by transmitting a beacon signal when neither a reference clock requesting signal nor user data is transmitted. In addition, the transmission of the beacon signal causes the in-phase signal to make potential transitions frequently, so that an HPD function can be realized. Thus, according to the first embodiment of the present technology, convenience in bidirectional transmission using the differential signal and the in-phase signal can be improved.

2. Second Embodiment

In the first embodiment of the present technology, description has been made of an example in which the beacon signal is transmitted in timings other than timings of transmission of the user data and the reference clock requesting signal (REFREQ) (see FIG. 8B). Thereby, the AC coupling capacitances are charged in any timing, and whether the sync device is connected can be confirmed (HPD) in any timing. However, because the in-phase signal is transmitted at all times, power consumption may be increased.

Accordingly, in a second embodiment of the present technology, an example of transmitting a beacon signal only in timing for HPD detection and timing in which AC coupling capacitances need to be charged in order to decrease power consumption will be described with reference to FIGS. 10 to 12.

[Example of Functional Configuration of Data Transmission System]

FIG. 10 is a schematic diagram showing an example of functional configuration of a data transmission system (data transmission system 500) in the second embodiment of the present technology.

In the second embodiment of the present technology, description will be made of an example in which a beacon signal is transmitted in each timing of receiving a vertical synchronizing signal (Vsync).

Incidentally, the data transmission system 500 shown in FIG. 10 is an example of modification of the data transmission system 10 shown in FIG. 1. The data transmission system 500 includes a source device 510 in place of the source device 100, and includes a sync device 520 in place of the sync device 200.

The source device 510 is different from the source device 100 in FIG. 1 in that the source device 510 detects the presence or absence of the beacon signal of an in-phase signal in timing corresponding to a transmitted vertical synchronizing signal (Vsync). As with the source device 100 in FIG. 1, the source device 510 includes a down transmission processing section 110, a differential driver 120, and an in-phase potential detecting section 130.

The source device 510 also includes an up reception processing section (up reception processing section 514) having a function of detecting the presence or absence of the beacon signal of a transmitted in-phase signal in timing corresponding to a transmitted vertical synchronizing signal (Vsync), in place of the up reception processing section 140 of the source device 100.

The source device 510 further includes a synchronizing signal timing obtaining section 511 for obtaining the timing of supply of synchronizing signals (the vertical synchronizing signal (Vsync) and a horizontal synchronizing signal (Hsync)).

The synchronizing signal timing obtaining section 511 detects a synchronizing signal in data output by the down transmission processing section 110, and obtains the timing of supply of the synchronizing signal. The synchronizing signal timing obtaining section 511 supplies the obtained timing of supply of the synchronizing signal to the up reception processing section 514.

As with the up reception processing section 140 in FIG. 1, the up reception processing section 514 analyzes a signal supplied from the in-phase potential detecting section 130, and outputs a result of the analysis. Incidentally, the operation of the up reception processing section 514 for user data and a reference clock requesting signal (REFREQ) is similar to that of the up reception processing section 140 in FIG. 1, and therefore description thereof will be omitted here.

The detection of whether the sync device is connected or not by the up reception processing section 514 will be described in the following. When the reference clock requesting signal (REFREQ) is received at a time of a start of communication, the up reception processing section 514 determines that the sync device is connected, and sets the potential of an HPD signal to an H-level. Thereafter, the up reception processing section 514 calculates, from the timing of supply of the synchronizing signal, which timing is supplied from the synchronizing signal timing obtaining section 511, the timing of reception of an in-phase signal transmitted in response to the synchronizing signal, and detects whether or not the sync device is connected in the calculated timing. That is, the up reception processing section 514 confirms whether the connection to the sync device is continued by determining whether a beacon signal is transmitted in response to the synchronizing signal. When the up reception processing section 514 cannot detect the beacon signal transmitted in response to the synchronizing signal (for example a cable is pulled out), the up reception processing section 514 changes the potential of the HPD signal to an L-level. When the up reception processing section 514 can detect the beacon signal transmitted in response to the synchronizing signal, on the other hand, the up reception processing section 514 maintains the potential of the HPD signal at the H-level.

The sync device 520 is different from the sync device 200 in FIG. 1 in that the sync device 520 transmits the beacon signal of the in-phase signal when the sync device 520 has received the vertical synchronizing signal (Vsync). As with the sync device 200 in FIG. 1, the sync device 520 includes a differential receiver 210, a down reception processing section 220, and an in-phase driver 240.

The sync device 520 also includes an up transmission processing section (up transmission processing section 523) having a function of transmitting the beacon signal in timing of receiving the vertical synchronizing signal (Vsync), in place of the up transmission processing section 230 of the sync device 200.

The sync device 520 further includes a synchronizing signal detecting section 521 for detecting the synchronizing signals (the vertical synchronizing signal (Vsync) and the horizontal synchronizing signal (Hsync)) in down data output by the down reception processing section 220.

The synchronizing signal detecting section 521 detects the synchronizing signals in the down data output by the down reception processing section 220, and supplies a result of the detection to the up transmission processing section 523. Incidentally, the second embodiment of the present technology assumes that the beacon signal is transmitted each time the vertical synchronizing signal (Vsync) is received. That is, the synchronizing signal detecting section 521 supplies a signal notifying the up transmission processing section 523 that the vertical synchronizing signal (Vsync) is received (Vsync notifying signal).

Incidentally, description will be made using the vertical synchronizing signal (Vsync) in the second embodiment of the present technology. However, when the beacon signal is transmitted each time the horizontal synchronizing signal (Hsync) is received, the synchronizing signal detecting section 521 notifies the up transmission processing section 523 that the horizontal synchronizing signal (Hsync) is received.

As with the up transmission processing section 230 in FIG. 1, the up transmission processing section 523 determines data to be transmitted from the sync device 520 to the source device 510, and supplies the determined data to the in-phase driver 240. The up transmission processing section 523 outputs the beacon signal to the in-phase driver 240 in each timing of the sync device 520 receiving the vertical synchronizing signal (Vsync).

In addition, when a reference clock requesting transmission instruction is supplied from the down reception processing section 220, the up transmission processing section 523 supplies a reference clock requesting signal (REFREQ) to the in-phase driver 240 via a signal line 231, as with the up transmission processing section 230 in FIG. 1.

In addition, when there is user data to be transmitted to the source device 510, the up transmission processing section 523 supplies the user data to the in-phase driver 240 after supplying the beacon signal. When the beacon signal is transmitted before the user data is transmitted, the user data can be transmitted after a capacitance (AC coupling capacitances 311 and 312) in a transmission path 300 is charged.

Incidentally, when none of the beacon signal, the reference clock requesting signal, and the user data is transmitted, the up transmission processing section 523 does not change the potential of the in-phase signal (for example maintains the potential of the in-phase signal at an L-level).

The in-phase signal generated by the up transmission processing section 523 will next be described with reference to FIGS. 11A and 11B.

[Example of Timing Charts]

FIGS. 11A and 11B are diagrams schematically showing an example of the in-phase signal transmitted in the data transmission system in the second embodiment of the present technology.

FIG. 11A shows an example of transmitting user data in addition to the beacon signal. FIG. 11B shows an example of transmitting the reference clock requesting signal in addition to the beacon signal.

FIGS. 11A and 11B schematically show periods in which the potential of the in-phase signal in the transmission path 300 makes transitions and states of charging of the AC coupling capacitances 311 and 312 with an axis of abscissas representing a time axis. In addition, FIGS. 11A and 11B schematically show periods in which the up reception processing section 514 detects whether or not the sync device is connected and a state of the HPD signal output from the up reception processing section 514 via a signal line 142.

The transmission of the beacon signal in the second embodiment of the present technology will be described in the following. In the second embodiment of the present technology, the beacon signal is transmitted in timing in which the sync device 520 has received the vertical synchronizing signal (Vsync). That is, the beacon signal is transmitted each time the Vsync notifying signal is transmitted from the synchronizing signal detecting section 521 to the up transmission processing section 523. Incidentally, before the beacon signal is transmitted, there is no signal (for example the potential of the in-phase signal remains static at an L-level), and therefore the capacitance (AC coupling capacitances 311 and 312) on the transmission path is not charged. A sufficient time to transmit a distinguishable signal after charging the capacitance on the transmission path is therefore set as a period of transmission of the beacon signal.

FIG. 11A shows beacon signal transmission periods 551 and 552 as periods of transmission of the beacon signal transmitted in timing in which the vertical synchronizing signal (Vsync) is received. In addition, FIG. 11B shows beacon signal transmission periods 561 and 562 as periods of transmission of the beacon signal.

The source device 510 calculates, from the timing of transmission of the vertical synchronizing signal (Vsync), the timing of reception of the in-phase signal transmitted in response to the vertical synchronizing signal (Vsync), and detects whether or not the sync device is connected in the calculated timing. That is, the presence or absence of the beacon signal is detected in a period corresponding to a period in which the beacon signal transmitted in response to the vertical synchronizing signal (Vsync) becomes distinguishable (period in which the AC coupling capacitances are charged to a distinguishable level). Incidentally, the source device 510 transmits down data including the vertical synchronizing signal (Vsync), and therefore the source device 510 can predict the timing of receiving the beacon signal. That is, when the vertical synchronizing signal (Vsync) transmitted by the source device 510 is used as the timing of transmission of the beacon signal, a large counter for managing the timing of receiving the beacon signal (timing of monitoring a state of connection by an HPD function) is rendered unnecessary. It suffices to thus make the HPD function work according to the timing of the vertical synchronizing signal (Vsync). Therefore a signal processing load in the source device 510 can be reduced.

The transmission of user data in the second embodiment of the present technology will next be described. When user data is transmitted in the second embodiment of the present technology, the beacon signal is transmitted before the user data is transmitted, and the user data is transmitted after the capacitance on the transmission path is charged. This can prevent the user data from not being transmitted due to the charging of the capacitance on the transmission path. FIG. 11A shows a beacon signal transmission period 553 representing a period of transmission of the beacon signal before the user data is transmitted and a user data transmission period 554 representing a transmission period for transmitting the user data.

The transmission of the reference clock requesting signal in the second embodiment of the present technology will next be described. As in the first embodiment of the present technology, the reference clock requesting signal in the second embodiment of the present technology is transmitted in timing in which a reference clock is necessary. Incidentally, before the reference clock requesting signal is transmitted, there is no signal (for example the potential of the in-phase signal remains static at an L-level), and therefore the capacitance on the transmission path is not charged. A sufficient time to transmit a distinguishable signal after charging the capacitance on the transmission path is therefore set as a period of transmission of the reference clock requesting signal.

[Example of Operation of Up Transmission Processing Section]

The operation of the up transmission processing section 523 in the second embodiment of the present technology will next be described with reference to a drawing.

Figure 12:
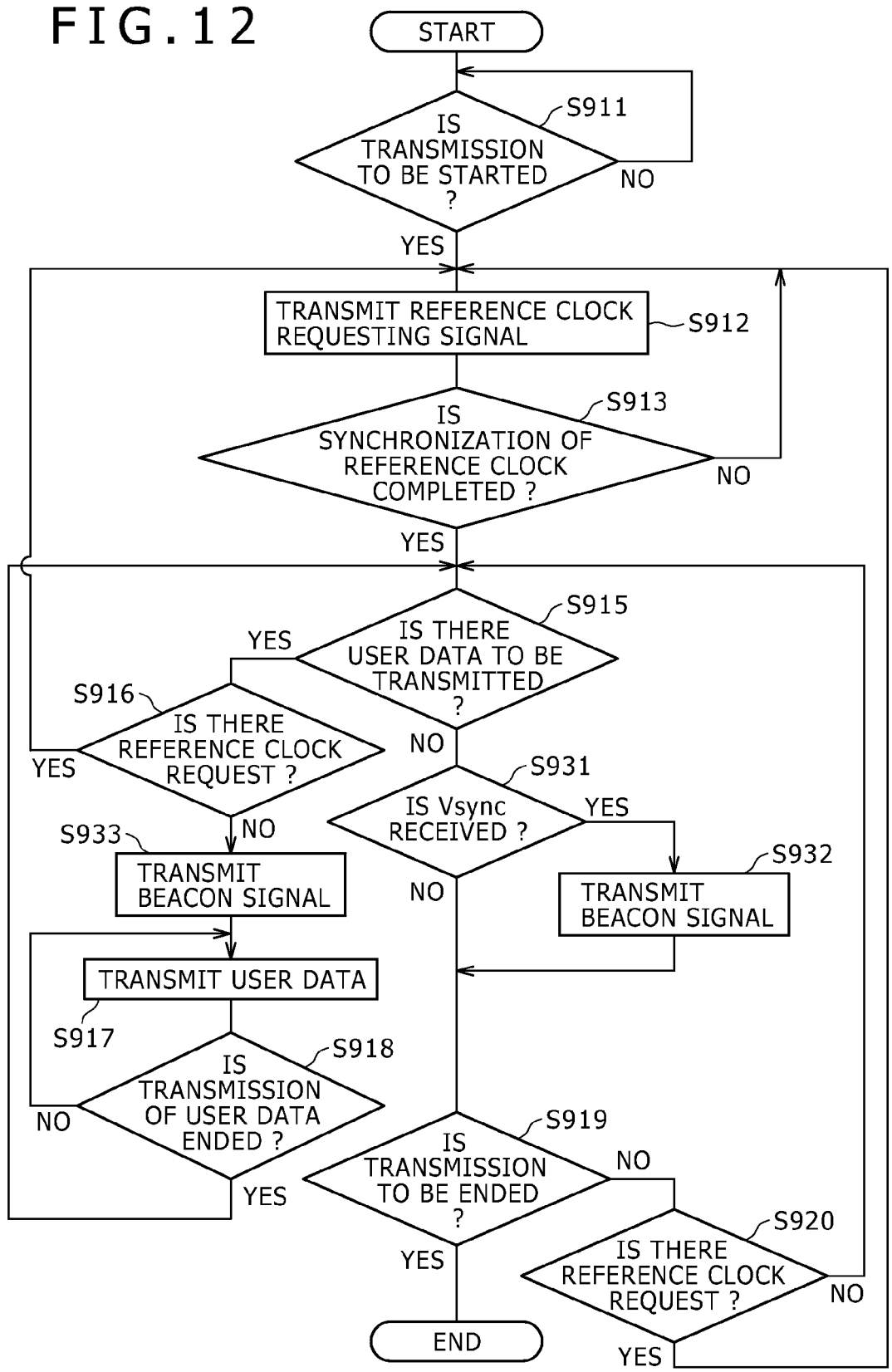
FIG. 12 is a flowchart of an example of a transmission process procedure by an up transmission processing section when the in-phase signal is transmitted from a sync device to a source device in the second embodiment of the present technology.

FIG. 12 is a flowchart of an example of a transmission process procedure by the up transmission processing section 523 when the in-phase signal is transmitted from the sync device 520 to the source device 510 in the second embodiment of the present technology.

Incidentally, the flowchart of FIG. 12 is an example of modification of the flowchart of FIG. 9, and is different from the flowchart of FIG. 9 in that the beacon signal is transmitted in response to the vertical synchronizing signal (Vsync) and in that the beacon signal is transmitted before the transmission of user data. Accordingly, in FIG. 12, the same parts as in FIG. 9 are identified by the same reference numerals as in FIG. 9, and description thereof will be omitted in the following.

When it is determined in step S913 that the synchronization of a reference clock in the down reception processing section 220 is completed, the process proceeds to step S915, where the up transmission processing section 523 determines whether there is user data as an object of transmission. Then, when it is determined in step S915 that there is no user data as an object of transmission, whether the vertical synchronizing signal (Vsync) is received is determined (step S931). When it is determined that the vertical synchronizing signal (Vsync) is received (step S931), the beacon signal is transmitted (step S932), and the process then proceeds to step S919. When it is determined that the vertical synchronizing signal (Vsync) is not received (step S931), the process proceeds to step S919.

Thus, in the transmission process by the up transmission processing section 523, the beacon signal is transmitted in timing in which the vertical synchronizing signal (Vsync) is received.

In addition, when it is determined in step S916 that the reference clock is not requested, the beacon signal is transmitted (step S933), and thereafter the user data is transmitted (step S917).

Thus, according to the second embodiment of the present technology, the beacon signal is transmitted according to the timing of reception of the synchronizing signal (Vsync) transmitted by the source device, so that a decrease in the frequency of transmission of the beacon signal and the HPD function can be made compatible with each other. Incidentally, because the source device knows the timing of transmission of the synchronizing signal, a decrease in the frequency of transmission of the beacon signal and the HPD function can be realized without a counter for measuring the timing of reception of the beacon signal.

3. Examples of Modification

In the first and second embodiments of the present technology, description has been made of examples of a data transmission system having one transmission path connecting a source device and a sync device to each other. However, the present technology is not limited to this. The present technology can be similarly carried out also in cases where there are a plurality of transmission paths. In addition, while the transmission of three signals (user data, a beacon signal, and a reference clock requesting signal) in an in-phase signal is assumed, the present technology is not limited to this either.

Assumed examples will be described below as examples of modification.

Figure 13:
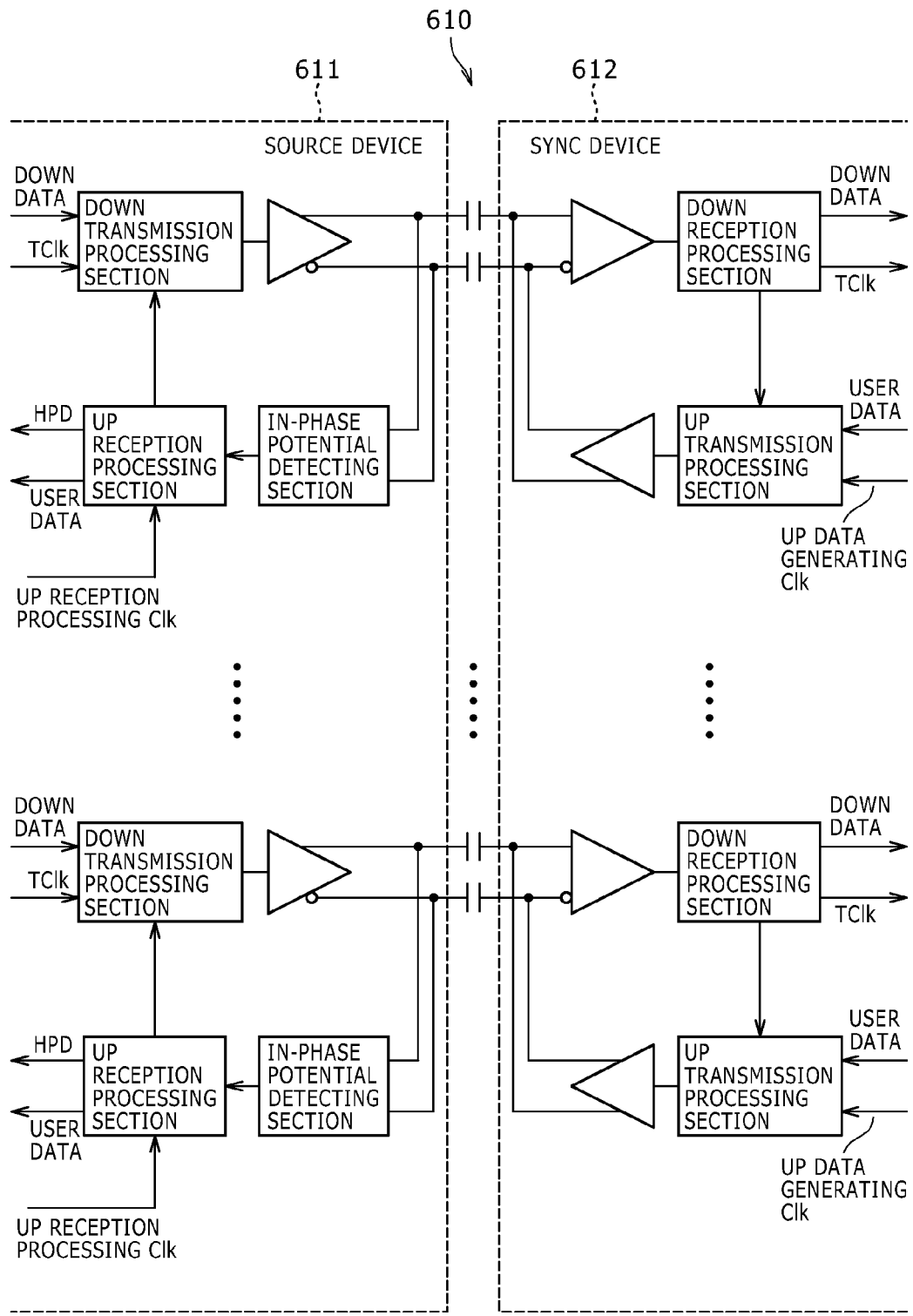
FIG. 13 shows a data transmission system in which a plurality of differential signals are transmitted from a source device to a sync device, as a first example of modification of embodiments of the present technology.

FIG. 13 shows a data transmission system (data transmission system 610) in which a plurality of differential signals are transmitted from a source device (source device 611) to a sync device (sync device 612), as a first example of modification of embodiments of the present technology.

The data transmission system 610 has a plurality of sets (hereinafter referred to as transmission units) of the source device 100, the sync device 200, and the transmission path 300 shown in the data transmission system 10 of FIG. 1. In a case where there are thus a plurality of transmission paths, the transmission paths to which the present technology is applied can be transmission paths provided with AC coupling.

Figure 14:
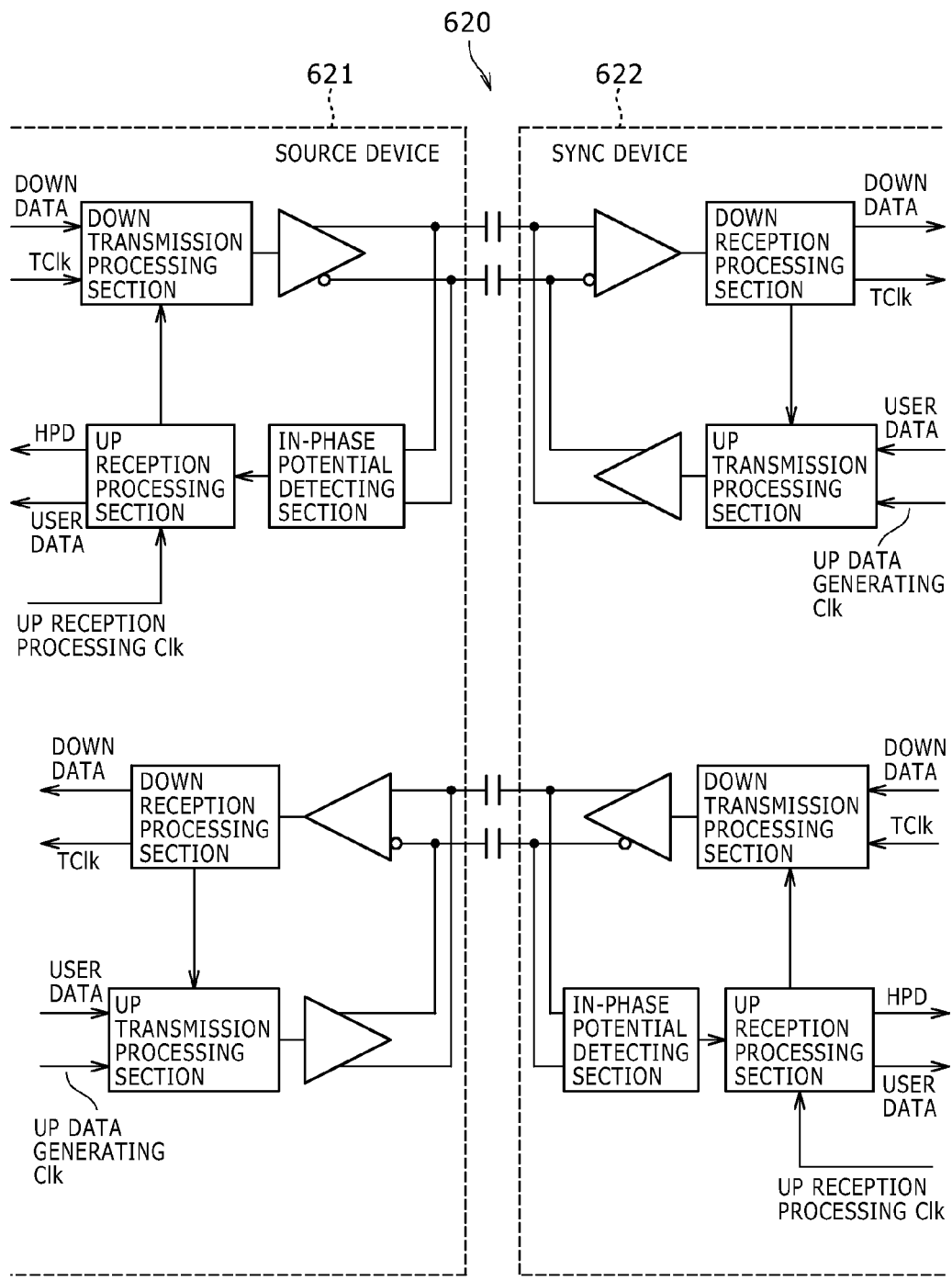
FIG. 14 shows a data transmission system including a transmission path for transmitting a differential signal from a source device to a sync device and a transmission path for transmitting a differential signal from the sync device to the source device, as a second example of modification of embodiments of the present technology.

FIG. 14 shows a data transmission system (data transmission system 620) including a transmission path for transmitting a differential signal from a source device to a sync device and a transmission path for transmitting a differential signal from the sync device 622 to the source device 621, as a second example of modification of embodiments of the present technology.

As shown in FIG. 14, the present technology is applicable to the data transmission system 620 designed to be able to transmit data at high speed bidirectionally between the source device (source device 621) and the sync device (sync device 622).

Incidentally, in the first embodiment and the second embodiment of the present technology, description has been made of an example in which the duty ratio (data mark ratio) in the in-phase signal is 50%. However, the present technology is not limited to this. When there is a margin for the in-phase detection performance of the comparator 144 in the up reception processing section 140, the duty ratio can be varied within an allowable detection range.

Incidentally, in the first embodiment and the second embodiment of the present technology, description has been made of an example in which user data is transmitted by the clock of 2.0 MHz, the reference clock requesting signal is transmitted by the clock of 1.0 MHz, and the beacon signal is transmitted by the clock of 0.5 MHz. However, relation between the clocks of the three signals is not limited to this. For example, there may be a case where no signal (clock of 0 MHz) is set as the reference clock requesting signal, user data is transmitted by the clock of 2.0 MHz, and the beacon signal is transmitted by the clock of 0.5 MHz. In this case, the present technology can be applied in a similar manner to the first embodiment and the second embodiment of the present technology by devising an HPD detection method.

For example, the source device first transmits the reference clock irrespective of HPD conditions. Then, the sync device transmits the beacon signal after synchronizing the reference clock in the down reception processing section. Then, when the source device has received the beacon signal, the potential of the HPD signal is set to an H-level (presence of connection), and the transmission of down data is started. The sync device thereafter outputs the beacon signal in the in-phase signal at all times, and switches transmission data to the user data when the user data is to be transmitted. When the reference clock in the down reception processing section goes out of synchronization, the sync device stops the transmission of the beacon signal. Detecting that the beacon signal is stopped, the source device sets the potential of the HPD signal to an L-level (absence of connection), and starts to transmit the reference clock.

Incidentally, in this example, the potential of the HPD signal is set to an L-level (absence of connection) immediately after the transmission of the reference clock requesting signal. However, there may be another case where the potential of the HPD signal is changed to an L-level when the beacon signal cannot be received even after the transmission of the reference clock is continued for a predetermined time.

Incidentally, in the first embodiment and the second embodiment of the present technology, description has been made of an example in which three pieces of data (user data, the reference clock requesting signal, and the beacon signal) are transmitted in the in-phase signal. However, the present technology is not limited to this. For example, there may be a case where data transmitted in the in-phase signal is only the user data and the beacon signal. In this case, the sync device transmits the beacon signal when there is no user data as an object of transmission. When the source device receives the beacon signal, the source device sets the potential of the HPD signal to an H-level (presence of connection). When the user data is transmitted from the sync device, the up data distinguishing processing block in the up reception processing section of the source device distinguishes the user data, and outputs the user data after encoding the user data, for example. In addition, when potential transitions in the in-phase signal are not detected, the source device sets the potential of the HPD signal to an L-level (absence of connection).

Incidentally, the up reception processing Clk shown in the first embodiment and the second embodiment of the present technology can be readily generated by using a clock obtained by frequency-dividing a system clock within the source device. In addition, the up data Clk can also be readily generated by using a clock obtained by frequency-dividing a system clock within the sync device.

Incidentally, providing the AC coupling capacitances 311 and 312 shown in the first embodiment and the second embodiment of the present technology to each of the source device and the sync device can widen a range of choices of devices to which to make connection.

Incidentally, in the second embodiment of the present technology, description has been made of an example in which the beacon signal is synchronized with the vertical synchronizing signal and the horizontal synchronizing signal (an example in which the beacon signal is transmitted when the vertical synchronizing signal and the horizontal synchronizing signal have been received). However, the present technology is not limited to this. A signal transmitted periodically in down data can be used as a signal for synchronizing the beacon signal as with the vertical synchronizing signal and the horizontal synchronizing signal.

Incidentally, in the embodiments of the present technology, description has been made of an example of a transmission path used in data transmission between devices (between apparatuses). However, the present technology is not limited to this. Embodiments of the present technology can be similarly carried out in cases where data is transmitted in a differential signal from one side to another side. For example, embodiments of the present technology can be carried out in cases where data is transmitted in a differential signal from one board to another board within a device. In addition, embodiments of the present technology can be carried out in cases where data is transmitted in a differential signal from one chip to another chip on a board.

Thus, according to embodiments of the present technology, convenience in bidirectional transmission using a differential signal and an in-phase signal can be improved.

It is to be noted that the foregoing embodiments represent an example for embodying the present technology, and that items in the embodiments have respective corresponding relations to specific inventive items in claims. Similarly, specific inventive items in claims have respective corresponding relations to items given the same names as the specific inventive items in the embodiments of the present technology. However, the present technology is not limited to the embodiments, and can be embodied by making various modifications to the embodiments without departing from the spirit of the present technology.

In addition, the process procedures described in the foregoing embodiments may be construed as a method having the series of procedures, and may be construed as a program for making a computer perform the series of procedures or a recording medium storing the program. Usable as the recording medium is for example a hard disk, a CD (Compact Disc), an MD (Minidisc), a DVD (Digital Versatile Disk), a memory card, or a Blu-ray disc (registered trademark).

Incidentally, the present technology can also adopt the following constitutions.

(1) A data receiving circuit including a transmitting section configure to transmit an identifying signal used to identify a state of connection of the data receiving circuit, the identifying signal making potential transitions periodically, in an in-phase signal via a transmission path having AC coupling to a data transmitting circuit for transmitting data in a differential signal via the transmission path.

(2) The data receiving circuit according to the above (1), wherein
data to be transmitted from the data receiving circuit to the data transmitting circuit is transmitted in the in-phase signal, and
the transmitting section transmits the identifying signal in a period of not transmitting the data to the data transmitting circuit.

(3) The data receiving circuit according to the above (2), wherein a duty ratio of the in-phase signal in a period of transmitting the data and the duty ratio of the in-phase signal in a period of transmitting the identifying signal are each about 50%.

(4) The data receiving circuit according to the above (1), further including a clock generating section configured to synchronize, in timing of being supplied with a reference clock signal for notifying a clock of the differential signal from the data transmitting circuit, a clock generated by the clock generating section with the supplied reference clock signal,
wherein when the transmitting section needs to receive the reference clock signal, the transmitting section transmits a reference clock signal requesting signal to be identified by the data transmitting circuit as a request to transmit the reference clock signal, the reference clock signal requesting signal making potential transitions periodically with a pulse width different from a pulse width of the identifying signal.

(5) The data receiving circuit according to the above (4), wherein when the transmitting section transmits neither of data to be transmitted to the data transmitting circuit nor the reference clock signal requesting signal, the transmitting section transmits the identifying signal.

(6) The data receiving circuit according to the above (4) or (5), further including a detecting section configured to detect a synchronizing signal included in the data transmitted from the data transmitting circuit,
wherein the transmitting section transmits the identifying signal when the synchronizing signal is detected by the detecting section.

(7) The data receiving circuit according to the above (6), wherein the detecting section detects, as the synchronizing signal, at least one of a vertical synchronizing signal and a horizontal synchronizing signal of an image constituting the data transmitted from the data transmitting circuit.

(8) The data receiving circuit according to the above (6), wherein when the transmitting section transmits data to the data transmitting circuit, the transmitting section starts to transmit the data after transmitting the identifying signal for about a time necessary to charge a capacitance of the AC coupling.

(9) A data transmitting circuit including:
a transmitting section configure to transmit a differential signal to a transmission path having AC coupling; and
a detecting section configured to detect whether an identifying signal used to identify a state of connection of a data receiving circuit, the identifying signal making potential transitions periodically, is supplied in an in-phase signal via the transmission path.

(10) The data transmitting circuit according to the above (9), wherein the detecting section detects the identifying signal in timing of receiving the in-phase signal transmitted by the data receiving circuit in response to reception of at least one of a vertical synchronizing signal and a horizontal synchronizing signal of an image constituting data transmitted in the differential signal.

(11) A data transmitting and receiving device including:
a first transmitting section configure to transmit a differential signal to a first transmission path having AC coupling; and
a second transmitting section configure to transmit an identifying signal used to identify a state of connection of the data transmitting and receiving device, the identifying signal making potential transitions periodically, in an in-phase signal via a second transmission path having AC coupling, the second transmission path being different from the first transmission path, to a data transmitting device for transmitting data in a differential signal via the second transmission path.

(12) A data transmission system including:
a data transmitting device including a transmitting section configure to transmit a differential signal to a transmission path having AC coupling and a receiving section configured to receive an in-phase signal in the transmission path; and
a data receiving device including a receiving section configured to receive the transmitted differential signal and a transmitting section configure to transmit an identifying signal used to identify a state of connection of the data receiving device, the identifying signal making potential transitions periodically, in the in-phase signal to the data transmitting device via the transmission path.

(13) A data receiving method including transmitting an identifying signal used to identify a state of connection of a data receiving circuit, the identifying signal making potential transitions periodically, in an in-phase signal via a transmission path having AC coupling to a data transmitting circuit for transmitting data in a differential signal via the transmission path.

What is claimed is:
1. A data receiving circuit, comprising:
a transmitting section configured to transmit an identifying signal used to identify a state of connection of the data receiving circuit, using an in-phase signal through a transmission path having alternating current coupling, to a data transmitting circuit for transmitting data using a differential signal through the transmission path; and
a clock generating section configured to synchronize a clock generated by the clock generating section with a reference clock signal from the differential signal of the data transmitting circuit;

wherein the transmitting section transmits a reference clock requesting signal which is identified by the data transmitting circuit as a request to transmit the reference clock signal, where a pulse width of the reference clock requesting signal is different from a pulse width of the identifying signal.

2. The data receiving circuit according to claim 1, wherein data to be transmitted from the data receiving circuit to the data transmitting circuit is transmitted using the in-phase signal; and
the transmitting section transmits the identifying signal in a period of not transmitting the data to the data transmitting circuit.

3. The data receiving circuit according to claim 2, wherein a duty ratio of the in-phase signal during a period of transmitting the data and the duty ratio of the in-phase signal during a period of transmitting the identifying signal is 50%.

4. The data receiving circuit according to claim 1, further comprising:
a detecting section configured to detect a synchronizing signal included in data transmitted from the data transmitting circuit;
wherein the transmitting section transmits the identifying signal when the synchronizing signal is detected by the detecting section.

5. The data receiving circuit according to claim 4, wherein the detecting section detects, at least one of a vertical synchronizing signal and a horizontal synchronizing signal of the data transmitted from the data transmitting circuit.

6. The data receiving circuit according to claim 4, wherein the transmitting section transmits the data after transmitting the identifying signal to charge a capacitance of the alternating current coupling.

7. A data transmitting circuit, comprising:
a transmitting section configured to transmit a differential signal to a transmission path having alternating current coupling; and
a detecting section configured to detect whether an identifying signal used to identify a state of connection of a data receiving circuit, is supplied using an in-phase signal through the transmission path;
wherein the detecting section detects the identifying signal from the in-phase signal transmitted by the data receiving circuit, in response to reception of at least one of a vertical synchronizing signal and a horizontal synchronizing signal of data transmitted using the differential signal.

8. The data transmitting circuit according to claim 7, wherein
data to be transmitted from the data receiving circuit to the data transmitting circuit is transmitted using the in-phase signal; and
the transmitting section transmits the identifying signal in a period of not transmitting the data to the data transmitting circuit.

9. The data transmitting circuit according to claim 7, wherein a duty ratio of the in-phase signal during a period of transmitting the data and the duty ratio of the in-phase signal during a period of transmitting the identifying signal is 50%.

10. The data transmitting circuit according to claim 7, wherein the transmitting section transmits the data after transmitting the identifying signal to charge a capacitance of the alternating current coupling.

11. A data transmitting and receiving device, comprising:
a first transmitting section configured to transmit a differential signal to a first transmission path having alternating current coupling; and a second transmitting section configured to transmit a first identifying signal used to identify a state of connection of the data transmitting and receiving device, using a first in-phase signal through a second transmission path having alternating current coupling, the second transmission path being different from the first transmission path, to a data transmitting device for transmitting data using a differential signal through the second transmission path;

wherein the first transmitting section includes a detecting section configured to detect whether a second identifying signal used to identify a state of connection of a data receiving circuit is supplied using an in-phase signal through the first transmission path; and wherein the detecting section detects the second identifying signal from the second in-phase signal transmitted by the data receiving circuit, in response to reception of at least one of a vertical synchronizing signal and a horizontal synchronizing signal of data transmitted using the differential signal.

12. The data transmitting and receiving device according to claim 11, wherein a duty ratio of the second in-phase signal during a period of transmitting the data and the duty ratio of the first in-phase signal during a period of transmitting the identifying signal is 50%.

13. The data transmitting and receiving device according to claim 11, wherein the second transmitting section transmits the data after transmitting the second identifying signal to charge a capacitance of the alternating current coupling.

14. A data transmission system, comprising:
a data transmitting device including a first transmitting section configured to transmit a differential signal to a transmission path having alternating current coupling, and a first receiving section configured to receive a first in-phase signal through the transmission path; and
a data receiving device including a second receiving section configured to receive the transmitted differential signal and a second transmitting section configured to transmit a first identifying signal used to identify a state of connection of the data receiving device, using the first in-phase signal to the data transmitting device through the transmission path; and wherein the second transmitting section includes a detecting section configured to detect whether a second identifying signal used to identify a state of connection of a data receiving circuit is supplied using a second in-phase signal through the transmission path; and wherein the detecting section detects the second identifying signal from the second in-phase signal transmitted by the data receiving circuit, in response to reception of at least one of a vertical synchronizing signal and a horizontal synchronizing signal of an image constituting data transmitted by the differential signal.

15. The data transmission system according to claim 14, wherein a duty ratio of the second in-phase signal during a period of transmitting the data and the duty ratio of the first in-phase signal during a period of transmitting the identifying signal is 50%.

16. The data transmission system according to claim 14, wherein the second transmitting section transmits the data after transmitting the second identifying signal to charge a capacitance of the alternating current coupling.

17. A data receiving method, comprising:
transmitting an identifying signal used to identify a state of connection of a data receiving circuit, the identifying signal making potential transitions periodically, in an in-phase signal via a transmission path having alternating current coupling, to a data transmitting circuit for transmitting data in a differential signal via the transmission path; and
synchronizing a clock generated by a clock generating section with a reference clock signal from the differential signal from the data transmitting circuit;
wherein a transmitting section transmits a reference clock requesting signal which is identified by the data transmitting circuit as a request to transmit the reference clock signal, where a pulse width of a the reference clock requesting signal is different from a pulse width of the identifying signal.

* * * * *